United States Patent
Jeong et al.

(10) Patent No.: US 11,012,185 B2
(45) Date of Patent: May 18, 2021

(54) APPARATUS AND METHOD FOR ENCODING AND DECODING USING POLAR CODE IN WIRELESS COMMUNICATION SYSTEM

(71) Applicant: Samsung Electronics Co., Ltd., Suwon-si (KR)

(72) Inventors: Hongsil Jeong, Suwon-si (KR); Min Jang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 88 days.

(21) Appl. No.: 16/376,485

(22) Filed: Apr. 5, 2019

(65) Prior Publication Data

US 2019/0312676 A1    Oct. 10, 2019

(30) Foreign Application Priority Data

Apr. 5, 2018    (KR) .......................... 10-2018-0039870

(51) Int. Cl.
*H04L 1/00* (2006.01)
*H03M 13/15* (2006.01)
*H03M 13/13* (2006.01)

(52) U.S. Cl.
CPC ........ *H04L 1/0057* (2013.01); *H03M 13/134* (2013.01); *H03M 13/15* (2013.01); *H04L 1/0013* (2013.01)

(58) Field of Classification Search
CPC ... H04L 1/0057; H04L 1/0013; H04L 1/0061; H04L 1/0067; H04L 1/0041;
(Continued)

(56) References Cited

U.S. PATENT DOCUMENTS

2012/0243600 A1*  9/2012  Jeong .................... H04L 1/0057
                                                             375/240
2015/0249473 A1   9/2015  Li et al.
(Continued)

FOREIGN PATENT DOCUMENTS

WO    2018/031715 A1    2/2018

OTHER PUBLICATIONS

H. Zhou, C. Zhang, W. Song, S. Xu and X. You, "Segmented CRC-Aided SC List Polar Decoding," 2016 IEEE 83rd Vehicular Technology Conference (VTC Spring), Nanjing, 2016, pp. 1-5. (Year: 2016).*

(Continued)

*Primary Examiner* — Cynthia Britt
(74) *Attorney, Agent, or Firm* — Jefferson IP Law, LLP

(57) ABSTRACT

The disclosure relates to a communication method and system for converging a 5th-Generation (5G) communication system for supporting higher data rates beyond a 4th-Generation (4G) system with a technology for Internet of Things (IoT). The disclosure may be applied to intelligent services based on the 5G communication technology and the IoT-related technology, such as smart home, smart building, smart city, smart car, connected car, health care, digital education, smart retail, security and safety services. The disclosure relates to encoding and decoding by using a polar code in a wireless communication system, and an operation method of a transmission-end apparatus includes determining segmentation and the number of segments, based on parameters associated with encoding of information bits, encoding the information bits according to the number of check bits, and transmitting the encoded information bits to a reception-end apparatus.

12 Claims, 13 Drawing Sheets

(58) Field of Classification Search
CPC .............. H03M 13/15; H03M 13/134; H03M 13/6356; H03M 13/618; H03M 13/09; H03M 13/2906; H03M 13/13; H03M 13/6362
See application file for complete search history.

(56) References Cited

U.S. PATENT DOCUMENTS

| | | | |
|---|---|---|---|
| 2016/0261280 A1* | 9/2016 | Jeong | H03M 13/611 |
| 2018/0034587 A1 | 2/2018 | Kim et al. | |
| 2018/0054800 A1 | 2/2018 | Yeo et al. | |
| 2019/0149268 A1* | 5/2019 | Xu | H03M 13/618 |
| | | | 714/755 |
| 2019/0149291 A1* | 5/2019 | Xiong | H04B 7/063 |
| | | | 370/329 |
| 2019/0223184 A1* | 7/2019 | Sarkis | H04L 1/0061 |
| 2019/0349005 A1* | 11/2019 | Jeong | H03M 13/1165 |
| 2020/0007161 A1* | 1/2020 | Dikarev | H03M 13/2789 |
| 2020/0235847 A1* | 7/2020 | Wang | H04L 1/00 |

OTHER PUBLICATIONS

Zte, 'Segmentation of Polar codes', R1-1711749, 3GPP TSG RAN WG1 NR Ad-Floc#2, Qingdao, China Jun. 30, 2017.
Samsung, 'Remaining Issues on Polar Code Sizes', R1-1800747, 3GPP TSG RAN WG1 Ad-hoc Meeting, Vancouver, Canada Jan. 22, 2018.
Zte et al., 'Segmentation of Polar code for large UCI', R1-1718914, 3GPP TSG RAN WG1 Meeting #90bis, Prague, Czechia Oct. 9, 2018.
International Search Report dated Jul. 11, 2019, issued in International Patent Application No. PCT/KR2019/004062.
NTT Docomo: "Rate matching of Polar codes", 3GPP Draft; R1-1711127, 3rd Generation Partnership Project (3GPP), Mobile Competence Centre ; 650, Route Des Lucioles ; F-06921 Sophia-Antipolis Cedex ; France, vol. RAB WG1, No. Qingdao, China; Jun. 27, 2017-Jun. 30, 2017; XP051300327; Jun. 26, 2017.
European Search Report dated Apr. 13, 2021, issued in European Application No. 19780923.9.

* cited by examiner

APPARATUS AND METHOD FOR ENCODING AND DECODING USING POLAR CODE IN WIRELESS COMMUNICATION SYSTEM

CROSS-REFERENCE TO RELATED APPLICATION(S)

This application is based on and claims priority under 35 U.S.C. 119(a) of a Korean patent application number 10-2018-0039870, filed on Apr. 5, 2018, in the Korean Intellectual Property Office, the disclosure of which is incorporated by reference herein in its entirety.

BACKGROUND

1. Field

The disclosure relates to a wireless communication system. More particularly, the disclosure relates to an apparatus and method for encoding and decoding using a polar code in a wireless communication system.

2. Description of the Related Art

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'beyond 4G network' or a 'post long-term evolution (LTE) system'. The 5G communication system is considered to be implemented in higher frequency (mm-Wave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like. In the 5G system, hybrid frequency shift keying (FSK) and quadrature amplitude modulation (QAM) (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the internet of things (IoT) where distributed entities, such as things, exchange and process information without human intervention. The internet of everything (IoE), which is a combination of the IoT technology and the big data processing technology through connection with a cloud server, has emerged. As technology elements, such as "sensing technology," "wired/wireless communication and network infrastructure," "service interface technology," and "Security technology" have been demanded for IoT implementation, a sensor network, a machine-to-machine (M2M) communication, machine type communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud radio access network (RAN) as the above-described Big Data processing technology may also be considered to be as an example of convergence between the 5G technology and the IoT technology.

The use of a polar code in the 5G system has been discussed. The polar code proposed by Arikan is the first error correcting code theoretically proven to achieve channel capacity. A concatenated outer code is used for encoding and decoding information bits using the polar code, and the concatenated outer code may include an error detection code such as a cyclic redundancy check (CRC) code, an error-correcting code such as a parity check code, and the like. As the use of the polar code is discussed, a method for improving the encoding and decoding processes performed using the polar code is needed.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a method and an apparatus for effectively performing encoding and decoding using a polar code in a wireless communication system.

Another aspect of the disclosure is to provide a method and an apparatus for stably and efficiently performing encoding and decoding using a polar code in a wireless communication system.

Another aspect of the disclosure is to provide a method and an apparatus for determining the number of segmentations in a wireless communication system.

Another aspect of the disclosure is to provide a method and an apparatus for determining whether to perform segmentation in a wireless communication system.

Additional aspects will be set forth in part in the description which follows and, in part, will be apparent from the description, or may be learned by practice of the presented embodiments.

According to various embodiments of the disclosure, a method of transmitting a signal by a terminal in a wireless communication system may include generating a bit sequence; determining to perform a code block segmentation for the bit sequence based on a number of bits of the bit sequence being larger than or equal to a first value; generating a plurality of segments by performing the code block segmentation to the bit sequence; generating a coded bit by encoding the plurality of segments; and transmitting, to a receiving apparatus, the coded bit.

According to various embodiments of the disclosure, a terminal of transmitting a signal in a wireless communication system may include a transceiver configured to transmit and receive a signal; and a controller coupled with the transceiver and configured to generate a bit sequence, determine to perform a code block segmentation for the bit sequence based on a number of bits of the bit sequence being larger than or equal to a first value, generate a plurality of segments by performing the code block segmentation to the bit sequence, generate a coded bit by encoding the plurality of segments, and transmit, to a receiving apparatus, the coded bit.

According to various embodiments of the disclosure, a method of receiving a signal by a base station in a wireless communication system may include receiving, from a transmitting apparatus, a coded bit; determining that a code block segmentation was performed to the coded bit based on a number of bits of a bit sequence for the coded bit being larger than or equal to a first value; generating a plurality of segments by performing the code block segmentation; and obtaining the bit sequence by decoding the plurality of segments.

According to various embodiments of the disclosure, a base station of receiving a signal in a wireless communication system may include a transceiver configured to transmit and receive a signal; and a controller coupled with the transceiver and configured to receive, from a transmitting apparatus, a coded bit, determine that a code block segmentation was performed to the coded bit based on a number of bits of a bit sequence for the coded bit being larger than or equal to a first value, generate a plurality of segments by performing the code block segmentation, and obtain the bit sequence by decoding the plurality of segments.

The apparatus and method according to various embodiments of the disclosure can improve decoding performance in case of constructing the polar code.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

Throughout the drawings, it should be noted that like reference numbers are used to depict the same or similar elements, features, and structures.

DETAILED DESCRIPTION

Figure 1:
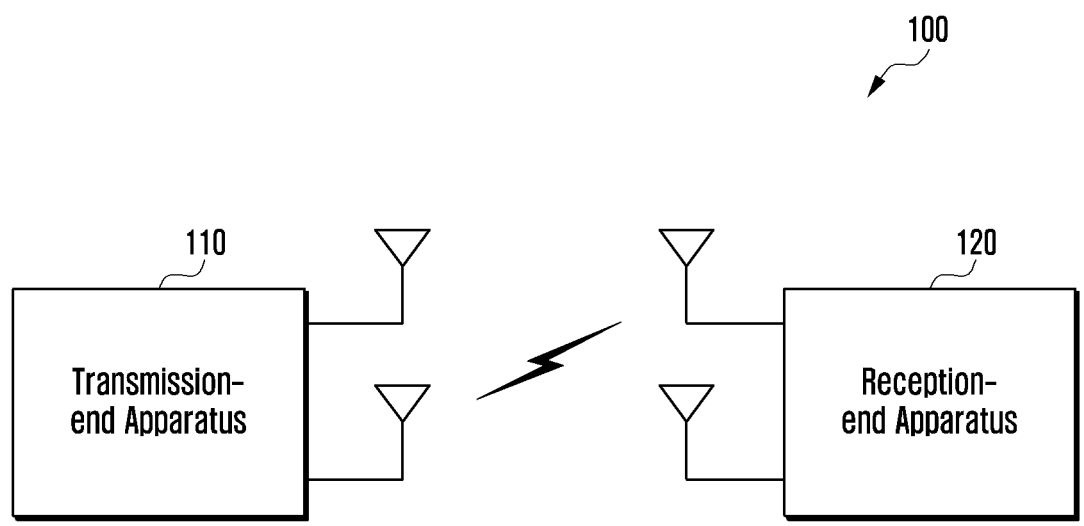
FIG. 1 illustrates a wireless communication system according to various embodiments of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

For the same reason, some elements in the drawings are exaggerated, omitted, or schematically illustrated. Also, the size of each element does not entirely reflect the actual size. In the drawings, the same or corresponding elements are denoted by the same reference numerals.

The advantages and features of the disclosure and the manner of achieving them will become apparent with reference to the embodiments described in detail below and with reference to the accompanying drawings. The disclosure may, however, be embodied in many different forms and should not be construed as being limited to the embodiments set forth herein. Rather, these embodiments are provided so that this disclosure will be thorough and complete and will fully convey the scope of the disclosure to those skilled in the art. To fully disclose the scope of the disclosure to those skilled in the art, the disclosure is only defined by the scope of claims.

It will be understood that each block of the flowchart illustrations, and combinations of blocks in the flowchart illustrations, may be implemented by computer program instructions. These computer program instructions may be provided to a processor of a general purpose computer, special purpose computer, or other programmable data processing apparatus to produce a machine, such that the instructions, which are executed via the processor of the computer or other programmable data processing apparatus, generate means for implementing the functions specified in the flowchart block or blocks. These computer program instructions may also be stored in a computer usable or computer-readable memory that may direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operational operations to be performed on the computer or other programmable apparatus to produce a computer implemented process such that the instructions that are executed on the computer or other programmable apparatus provide operations for implementing the functions specified in the flowchart block or blocks.

In addition, each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The term "unit," as used herein, may refer to a software or hardware component or device, such as a field programmable gate array (FPGA) or application specific integrated circuit (ASIC), which performs certain tasks. A unit may be configured to reside on an addressable storage medium and configured to execute on one or more processors. Thus, a module or unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and modules. In addition, the components and units may be implemented to operate one or more central processing units (CPUs) in a device or a secure multimedia card.

Terms used in this disclosure are used only to describe certain embodiments and may not be intended to limit the scope of other embodiments. The singular expressions may include plural expressions unless the context clearly dictates otherwise. Terms used herein, including technical and scientific terms, may have the same meaning as commonly understood by one of ordinary skill in the art. Among terms used herein, terms defined in a generic dictionary may be interpreted as having the same or similar meaning as the contextual meanings of the related art and, unless explicitly defined herein, may not be interpreted as ideally or excessively formal sense. In some cases, terms, even defined herein, are not construed to exclude embodiments of the disclosure.

In various embodiments of the disclosure described below, a hardware-based approach is illustrated by way of example. However, such embodiments may include techniques that use both hardware and software, so that a software-based approach is not excluded from various embodiments.

The disclosure relates to an apparatus and method for encoding and decoding using a polar code in a wireless communication system. In particular, this disclosure describes a technique for determining the number of parity check bits, based on parameters associated with encoding and decoding of information bits in a wireless communication system.

Hereinafter, a term referring to parameters, a term referring to information bits, a term referring to a channel, a term referring to control information, a term referring to network entities, a term referring to a component of an apparatus, etc. are used for convenience of explanation. Accordingly, the disclosure is not limited to the following terms, and other terms having equivalent technical meanings may be used alternatively.

Further, the disclosure describes various embodiments using terms used in some communication standards (e.g., 3rd generation partnership project (3GPP)), but this is merely exemplary. Various embodiments of the disclosure may be easily modified and applied in other communication systems as well.

Generally, when data is transmitted or received between a transmitter and a receiver in a communication system, data errors may occur due to noise existing in a communication channel An error-correcting coding scheme is designed for a receiver to correct an error generated by a communication channel Such an error-correcting code is also referred to as channel coding. An error-correcting coding technique is a technique for adding a redundant bit to data to be transmitted.

There are various schemes for the error-correcting coding technique. For example, a convolutional coding scheme, a turbo coding scheme, a low-density parity-check (LDPC) coding scheme, and a polar coding scheme have been known in the art.

Among them, polar codes are the first codes which are theoretically proven to achieve point-to-point channel capacity by using channel polarization phenomena. The polar codes allow a code design optimized for each channel or code rate with density evolution, Gaussian approximation (GA), reciprocal channel approximation (RCA), and the like.

Among these error-correcting coding schemes, a polar code is the first code which is theoretically proven to achieve the point-to-point channel capacity with low decoding complexity by using the channel polarization phenomenon occurring in the successive cancellation (SC) decoding. In addition, it is confirmed that the polar code is excellent in practical performance as well as in theoretical performance. Especially, in case of using SC-list (SCL) decoding with a concatenated outer code such as a cyclic redundancy check (CRC) code, it is confirmed that the polar code has superior performance compared with other channel codes. Accordingly, it was agreed to use the polar code when transmitting control information via a control channel in the 3GPP Release-15 new radio (NR).

The polar code is an error-correcting code proposed by E. Arikan in 2008 and the first error-correcting code which is proven to achieve the channel capacity (i.e., data transmission limit) in all binary discrete memoryless channels (B-DMCs) while having low encoding/complexity performance. Compared to other channel capacity-approaching codes such as a turbo code and a LDPC code, the polar code has advantages in error-correcting performance and decoding complexity when short-length codes are transmitted. Therefore, in 2017, the polar code has been determined to be used for transmission of short-length control information in the 3GPP NR standardization for the 5G mobile communication.

The disclosure relates to error-correcting codes for correcting and restoring errors and losses which occur or are likely to occur due to various causes such as noise and interference in a process of transmitting or storing data. Specifically, the disclosure relates to encoding and decoding of a polar code, and also relates to an apparatus and method for more efficiently encoding and decoding information in a process of transmitting and receiving information in a mobile communication system and a broadcasting system.

FIG. 1 illustrates a wireless communication system according to various embodiments of the disclosure.

Referring to FIG. 1, a transmission-end apparatus 110 and a reception-end apparatus 120 as parts of nodes using a radio channel in a wireless communication system 100 are shown. Although FIG. 1 shows one transmission-end apparatus 110 and one reception-end apparatus 120, a plurality of transmission-end apparatuses or a plurality of reception-end apparatuses may be included. In addition, even though the transmission-end apparatus 110 and the reception-end apparatus 120 are described herein as separate entities for convenience of explanation, the functions of the transmission-end apparatus 110 and the reception-end apparatus 120 may be changed. For example, in an uplink of a cellular communication system, the transmission-end apparatus 110 may be a terminal, and the reception-end apparatus 120 may be a base station. In case of a downlink, the transmission-end apparatus 110 may be a base station, and the reception-end apparatus 120 may be a terminal.

In some embodiments, the transmission-end apparatus 110 may determine the number of parity check bits, based on parameters associated with encoding of information bits, encode the information bits according to the number of parity check bits, and transmit the encoded information bits to the reception-end apparatus 120. In some embodiments, the reception-end apparatus 120 may receive the encoded information bits from the transmission-end apparatus 110, determine the number of parity check bits, based on parameters associated with decoding of the information bits, and decode the information bits according to the number of parity check bits.

Figure 2:
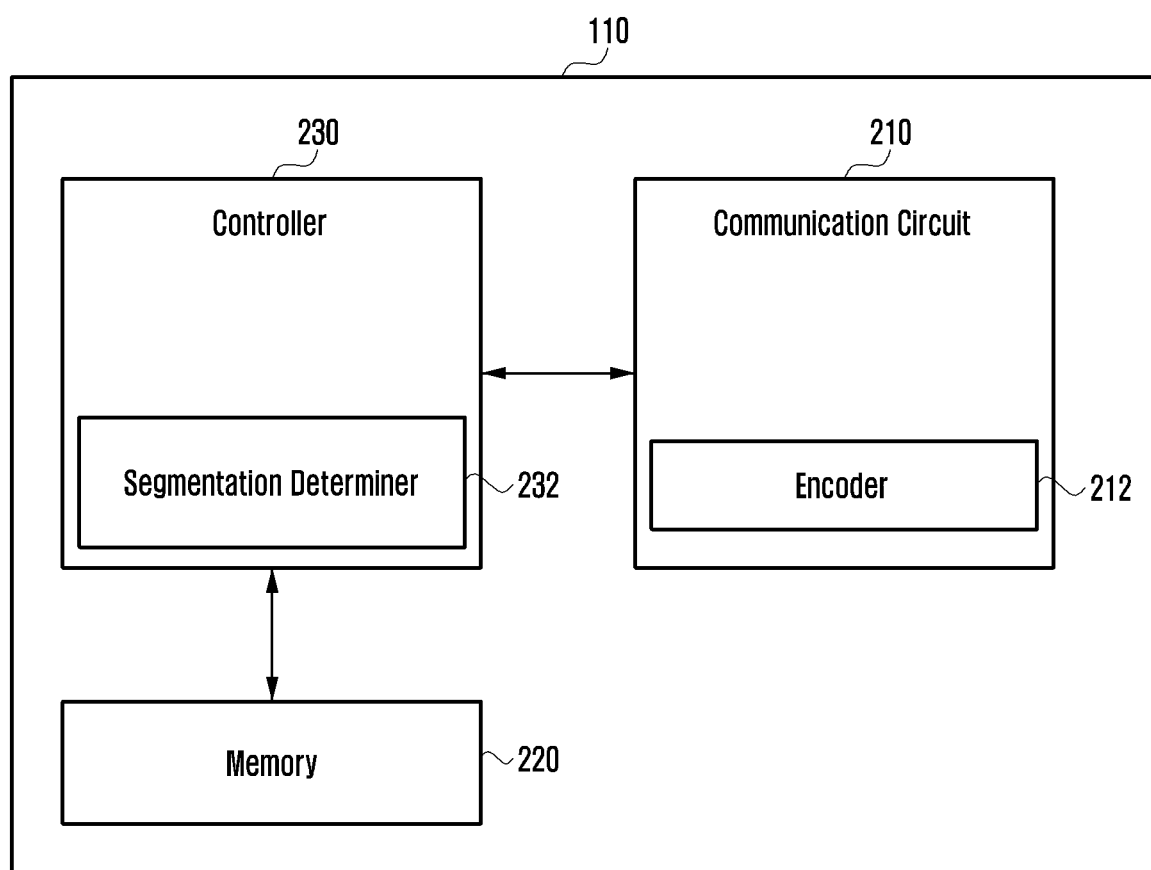
FIG. 2 illustrates a configuration of a transmission-end apparatus in a wireless communication system according to various embodiments of the disclosure.

FIG. 2 illustrates configuration of a transmission-end apparatus in a wireless communication system according to various embodiments of the disclosure. The configuration illustrated in FIG. 2 can be understood as components or elements of the transmission-end apparatus 110. Such components or elements refer to units for processing at least one function or operation and may be implemented by hardware or a combination of hardware and software.

Referring to FIG. 2, the transmission-end apparatus 110 may include a communication circuit 210, a memory 220, and a controller 230.

The communication circuit 210 may perform functions for transmitting and receiving a signal through a radio channel For example, the communication circuit 210 may perform a function of converting a baseband signal and a bit sequence in accordance with a physical layer standard of a system. For example, in case of data transmission, the communication circuit 210 may generate complex symbols by encoding and modulating a transmission bit sequence. Also, in case of data reception, the communication circuit 210 may recover a reception bit sequence by demodulating and decoding a baseband signal. In addition, the communication circuit 210 may up-convert a baseband signal to a radio frequency (RF) band signal and then transmit the RF signal through an antenna, or down-convert an RF band signal received through an antenna to a baseband signal.

For the above, the communication circuit 210 may include a transmission filter, a reception filter, an amplifier, a mixer, an oscillator, a digital-to-analog converter (DAC), an analog-to-digital converter (ADC), and the like. Also, the communication circuit 210 may include a plurality of transmission/reception paths. Further, the communication circuit 210 may include at least one antenna array composed of a plurality of antenna elements. In view of hardware, the communication circuit 210 may be composed of a digital unit and an analog unit. The analog unit may be divided into a plurality of sub-units according to operation power, operation frequencies, or the like.

The communication circuit 210 transmits and receives a signal as described above. Accordingly, the communication circuit 210 may be referred to as a transmitter, a receiver, or a transceiver. In the following description, transmission and reception performed via a radio channel are used as meaning including that the above-described processing is performed by the communication circuit 210. Also, the communication circuit 210 may further include a backhaul communication part for communicating with other network entities connected through a backhaul network.

The communication circuit 210 may include an encoder 212 to perform encoding according to various embodiments of the disclosure. The communication circuit 210 may encode information bits to be transmitted, based on the number of parity check bits determined through the controller 230.

The memory 220 may store a basic program, an application program, setting information, and/or data which are required for the operation of the transmission-end apparatus 110. The memory 220 may be composed of a volatile memory and/or a nonvolatile memory. The memory 220 may provide the stored program, information and/or data at the request of the controller 230.

The controller 230 may control the overall operations of the transmission-end apparatus 110. For example, the controller 230 may transmit and receive a signal through the communication circuit 210. In addition, the controller 230 may write or read data into or from the memory 220. The controller 230 may include at least one processor or microprocessor, or may be a part of a processor. The controller 230 may control the operation of components included in the communication circuit 210.

According to various embodiments, the controller 230 may include a segmentation determiner 232. The segmentation determiner 232 may determine whether to perform segmentation, based on at least one of the number of information bits, the number of encoding bits, and the number of CRC bits. Also, the segmentation determiner 232 may determine the number of segmentations, based on at least one of the number of encoding bits and the number of CRC bits. The controller 230 may control the communication circuit 210 to encode the information bits according to the determined number of parity check bits and transmit the encoded information bits to a reception-end apparatus. In addition, the controller 230 may control the transmission-end apparatus to perform operations according to various embodiments to be described below.

Figure 3:
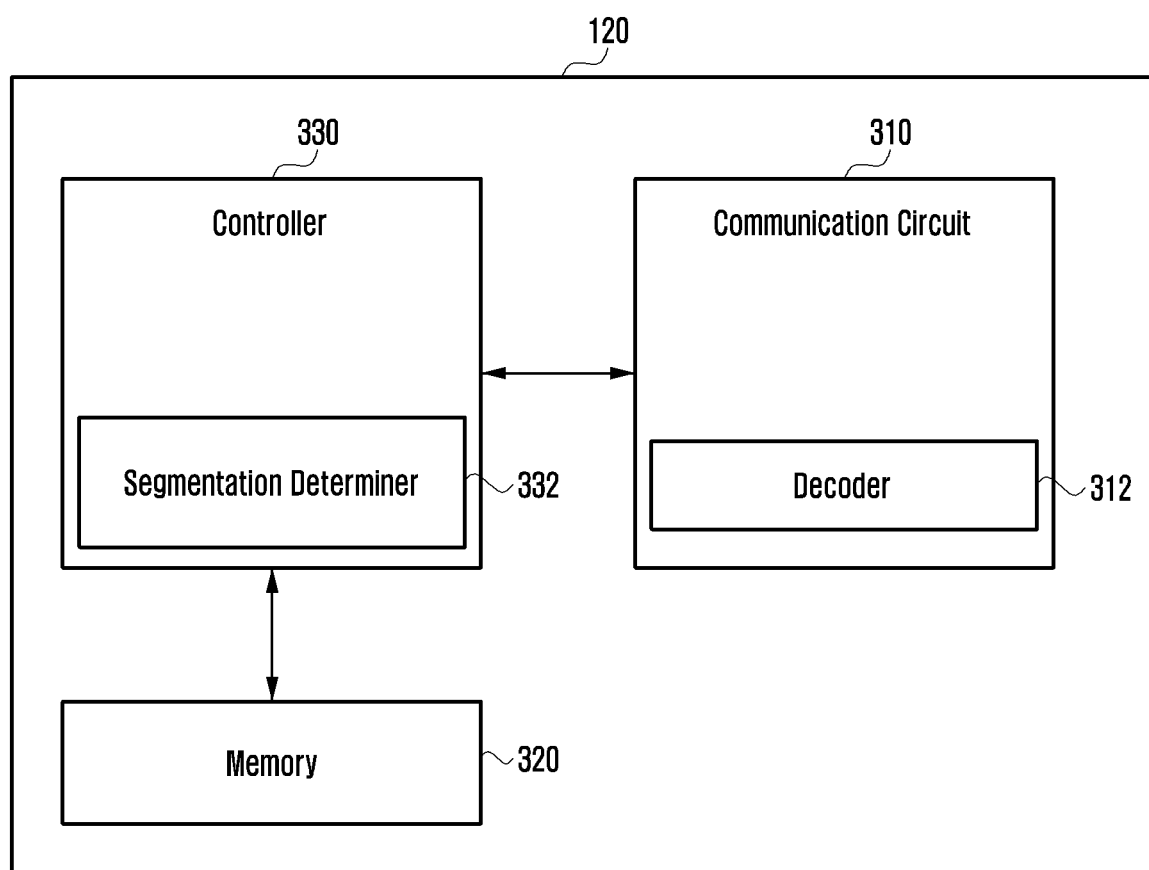
FIG. 3 illustrates a configuration of a reception-end apparatus in a wireless communication system according to various embodiments of the disclosure.

FIG. 3 illustrates configuration of a reception-end apparatus in a wireless communication system according to various embodiments of the disclosure. The configuration illustrated in FIG. 3 can be understood as components or elements of the reception-end apparatus 120. Such components or elements refer to units for processing at least one function or operation and may be implemented by hardware or a combination of hardware and software.

Referring to FIG. 3, the reception-end apparatus 120 may include a communication circuit 310, a memory 320, and a controller 330.

The communication circuit 310 may perform functions for transmitting and receiving a signal through a radio channel For example, the communication circuit 310 may perform a function of converting a baseband signal and a bit sequence in accordance with a physical layer standard of a system. For example, in case of data transmission, the communication circuit 310 may generate complex symbols by encoding and modulating a transmission bit sequence. Also, in case of data reception, the communication circuit 310 may recover a reception bit sequence by demodulating and decoding a baseband signal. In addition, the communication circuit 310 may up-convert a baseband signal to a RF band signal and then transmit the RF signal through an antenna, or down-convert an RF band signal received through an antenna to a baseband signal.

For the above, the communication circuit 310 may include a transmission filter, a reception filter, an amplifier, a mixer, an oscillator, a DAC, an ADC, and the like. Also, the communication circuit 310 may include a plurality of transmission/reception paths. Further, the communication circuit 310 may include at least one antenna array composed of a plurality of antenna elements. In view of hardware, the communication circuit 310 may be composed of a digital unit and an analog unit. The analog unit may be divided into a plurality of sub-units according to operation power, operation frequencies, or the like.

The communication circuit 310 transmits and receives a signal as described above. Accordingly, the communication circuit 310 may be referred to as a transmitter, a receiver, or a transceiver. In the following description, transmission and reception performed via a radio channel are used as meaning including that the above-described processing is performed by the communication circuit 310. Also, the communication circuit 310 may further include a backhaul communication part for communicating with other network entities connected through a backhaul network.

The communication circuit 310 may include a decoder 312 to perform decoding according to various embodiments of the disclosure. The communication circuit 310 may decode received information bits, based on the number of parity check bits determined through the controller 330.

The memory 320 may store a basic program, an application program, setting information, and/or data which are required for the operation of the reception-end apparatus 120. The memory 320 may be composed of a volatile memory and/or a nonvolatile memory. The memory 320 may provide the stored program, information and/or data at the request of the controller 330.

The controller 330 may control the overall operations of the reception-end apparatus 120. For example, the controller 330 may transmit and receive a signal through the communication circuit 310. In addition, the controller 330 may write or read data into or from the memory 320. The controller 330 may include at least one processor or microprocessor, or may be a part of a processor. The controller 330 may control the operation of components included in the communication circuit 310.

According to various embodiments, the controller 330 may include a segmentation determiner 332. The segmentation determiner 332 may determine whether to perform segmentation, based on at least one of the number of information bits, the number of encoding bits, and the number of CRC bits. Also, the segmentation determiner 332 may determine the number of segmentations, based on at least one of the number of encoding bits and the number of CRC bits. The controller 330 may control the communication circuit 310 to receive the encoded information bits from a transmission-end apparatus and decode the encoded information bits according to the determined number of parity check bits. In addition, the controller 330 may control the reception-end apparatus to perform operations according to various embodiments to be described below.

Figure 4:
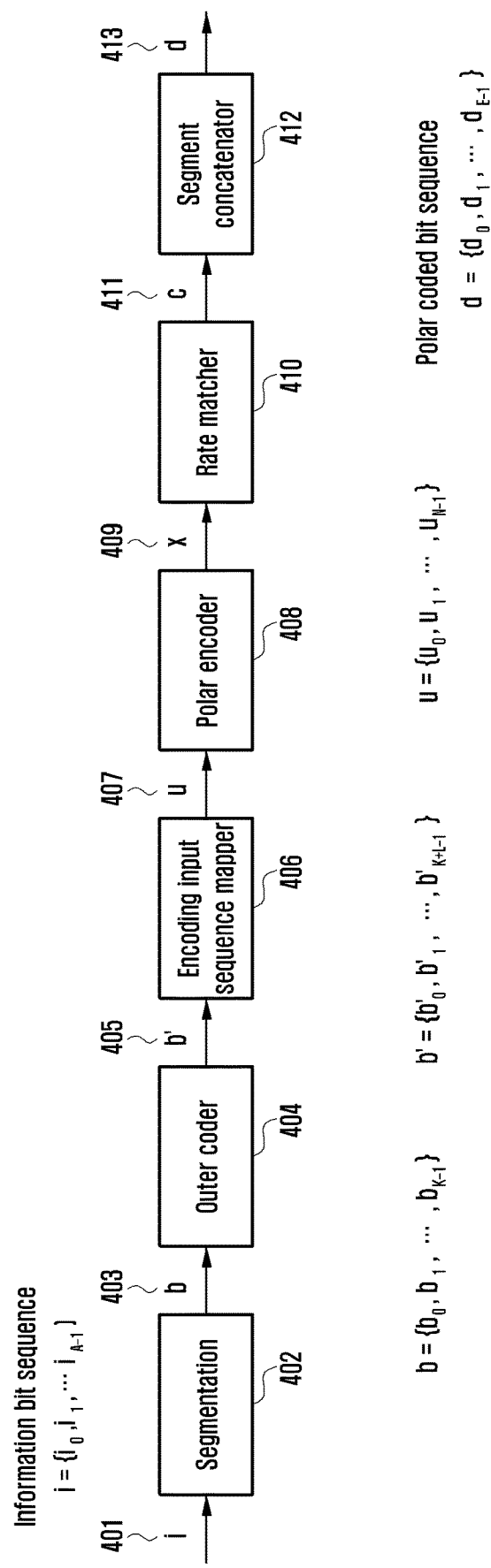
FIG. 4 illustrates a functional configuration of a transmission-end apparatus that performs encoding in a wireless communication system according to various embodiments of the disclosure.

FIG. 4 illustrates a functional configuration of a transmission-end apparatus that performs encoding in a wireless communication system according to various embodiments of the disclosure. The configuration shown in FIG. 4 may be understood as a part of the communication circuit 210 of the transmission-end apparatus 110 shown in FIGS. 1 and 2 according to various embodiments of the disclosure.

Referring to FIG. 4, the transmission-end apparatus 110 may include a segmentation 402, an outer coder 404, an encoding input sequence mapper 406, a polar encoder 408, a rate matcher 410, and a segment concatenator 412 according to various embodiments of the disclosure.

In some embodiments, some of the above components may be omitted or any other component may be added, based on system requirements or the like. The number of information bits to be transmitted by the transmission-end apparatus may be denoted by "A," and the number of codeword bits polar-coded and transmitted via a channel may be denoted by "E."

In some embodiments, the transmission-end apparatus 110 generates an information bit sequence. For example, the transmission-end apparatus 110 inputs an information bit sequence $i=\{i_0, i_1, \ldots i_A\}$ 401 to be transmitted into the segmentation $b=\{b_0, b_1, \ldots b_{K-1}\}$ 402. This information bit sequence is segmented into a plurality of segments, as needed, by the segmentation 402. The segmented information bit sequence 403 is inputted into the outer coder 404. Hereinafter, for the sake of convenience, in the outer coder 404, the encoding input sequence mapper 406, and the polar encoder 408, the r-th information bit sequence corresponding to the r-th segment will be described as an example. The outer coder 404 may outer-encode the input information bit sequence "b" 403. For example, the outer coder 404 may encode an input information bit sequence "b" 403 to improve performance. Such outer coding may be used to improve the performance of a maximum likelihood (ML)-like decoder that performs decoding in consideration of a plurality of codeword candidates, as in SCL decoding or SC-stack (SCS) decoding of a polar code. In some embodiments, an error detection code such as a CRC code or an error correction code such as a Bose-Chaudhuri-Hocquenghem (BCH) code and a parity check code may be used as an outer code. Only one outer code may be used, or two or more outer codes may be used in combination. In some embodiments, the length of the entire parity bit generated by one or more outer codes may be denoted by "L," and a bit sequence generated as a result of outer coding may be expressed as b'={b'$_0$, b'$_1$, ... b'$_{K+L-1}$}. According to another embodiment, when no outer coding is considered, L is 0, b' is equal to b, and the outer coder 404 may be omitted.

The encoding input sequence mapper 406 may map the bit sequence 405, generated as a result of the outer coding, to a bit sequence 407 for polar encoding. That is, for pole-coded encoding of the bit sequence 407, the encoding input sequence mapper 406 may map or allocate the bit sequence b' 405 to a bit sequence u={u$_0$, u$_1$, ... u$_{N-1}$} 407 having a length N. In some embodiments, N, which is the size of a mother code of a polar code, may be represented as a power of two, and may be determined by a predetermined criterion from among values greater than the sum of the information bit and the length of the entire parity bit generated by the outer code. In some embodiments, the bit sequence u 407 is an input bit sequence of the polar encoder 408, and bits of the output bit sequence b' 405 of the outer coder 404 may be mapped to the bit sequence u 407 according to a predetermined method and criterion. The above-described mapping method may be performed in consideration of a rate-matching operation to be performed later. As an example, in case of the 3GPP Release-15 NR code, a bit index of the bit sequence u 407 to which each bit of the output bit sequence b' 405 are mapped is predefined in the form of a sequence. Each bit of the encoding input bit sequence obtained by this operation may be interpreted as if it passes through split channels or sub-channels of different qualities by channel polarization. Because of the above-described features, a process of mapping b' 405 to u 407 may be represented as a sub-channel allocation process, and this process may be performed at the encoding input sequence mapper 406. In some embodiments, among bits of u 407, a bit corresponding to a sub-channel to which b' 405 is mapped may be referred to as an unfrozen bit, and a bit corresponding to another sub-channel may be referred to as a frozen bit. In some embodiments, the unfrozen bit may be fixed to a predetermined value and may be determined in general to be a bit value of zero.

The polar encoder 408 may receive the encoding input bit sequence 407 generated at the encoding input sequence mapper 406 and perform polar encoding. That is, the polar encoder 408 may receive the encoding input bit sequence u 407 from the encoding input sequence mapper 406, polar-encode the received sequence 407, and output a bit sequence 409 having the same length. Specifically, the polar encoder 408 may generate an encoding output bit sequence x={x$_0$, x$_1$, ... x$_{N-1}$}=uG$_N$ 409 having the same length N by multiplying the encoding input bit sequence u 407 having the length N with a generator matrix G of a polar code. Generally, the generator matrix G of the polar code may be defined as Equation 1.

$$G_N = B_N F^{\otimes log_2 N}$$  Equation 1

In Equation 1, G$_N$ denotes a generator matrix, F denotes a matrix $$F = \begin{bmatrix} 1 & 0 \\ 1 & 1 \end{bmatrix},$$

N denotes the size of a mother code of a polar code, and a superscript operation $\otimes$n denotes a Kronecker power of n times. For example, $$F^{\otimes 2} = \begin{bmatrix} F & 0 \\ F & F \end{bmatrix} \text{ and } F^{\otimes 3} = \begin{bmatrix} F^{\otimes 2} & 0 \\ F^{\otimes 2} & F^{\otimes 2} \end{bmatrix}.$$

Also, B$_N$ denotes a bit-reversal permutation matrix having a size N×N. For example {a$_0$, a$_4$, a$_2$, a$_6$, a$_1$, a$_5$, a$_3$, a$_7$} may be obtained by multiplying {a$_0$, a$_1$, a$_2$, a$_3$, a$_4$, a$_5$, a$_6$, a$_7$} by B$_8$. However, a generator matrix having a simple form except for B$_8$, which has been recently used in various documents and systems including the 3GPP NR, may be defined as Equation 2.

$$G_N = F^{\otimes log_2 N}$$  Equation 2

In Equation 2, G$_N$ denotes a generator matrix, F denotes a matrix $$F = \begin{bmatrix} 1 & 0 \\ 1 & 1 \end{bmatrix},$$

N denotes the size of a mother code of a polar code, and a superscript operation $\otimes$n denotes a Kronecker power of n times. In embodiments to be described later, unless otherwise indicated, a generator matrix is assumed to be $G_N = F^{\otimes log_2 N}$. The description based on this assumption may be easily applied to a polar code using a generator matrix defined as $G_N = B_N F^{\otimes log_2 N}$ on the basis of the bit-reversal permutation operation. The generator matrix multiplication may be implemented in various ways that can output the same result.

The rate matcher 410 may output the output bit sequence 409 of the polar encoder 408 as a bit sequence. That is, the rate matcher 410 may receive the output bit sequence x 409 from the polar encoder 408 and output a bit sequence 411 of a length E to be transmitted. The length to be transmitted for the i-th segment ($0 \leq i < C$, C is the number of segments) is E$_i$. However, only one segment is described for convenience of explanation, so that the output bit length of the rate matcher 410 will be described as E. In some embodiments, a process of generating a bit sequence of a length E to be transmitted from the coded output bit sequence x may be referred to as a rate matching. In some embodiments, a transmission bit sequence obtainable through such a rate matching may be expressed as c={c$_0$, c$_1$, ... c$_{g-1}$}. In some embodiments, the rate matcher 410 may rearrange the coded output bit sequence x 409 to improve the coding and decoding performance of a polar code. For example, in the 3GPP Release-15 NR, the coded output bit sequence of a polar code x 409 may be interleaved in 32 sub-block units and rearranged as $$x' = \{x'_0, x'_1, \ldots, x'_{N-1}\}.$$

In addition, the rate matcher 410 may store the rearranged sequence x' in a circular buffer and generate a codeword sequence of a length E by sequentially extracting the sequence x' from a predetermined bit position.

A detailed operation of the rate matcher 410 is as follows. In some embodiments, when the length E of the codeword is greater than the size N of the mother code of the polar code, the rate matcher 410 may perform a repetition operation. In some embodiments, when the length E of the codeword is less than the size N of the mother code of the polar code, the rate matcher 410 may perform one of a puncturing operation or a shortening operation. In some embodiments, due to a punctured or shortened bit in the sub-channel allocation process of the encoding input sequence mapper 406, some sub-channels may not be allocated for information bits. The shortening process of the rate matcher 410 may include a process of mapping the frozen bit to predetermined bits in the input bit sequence u 407 of the polar code such that predetermined bits in the coded output bit sequence x 409 become '0'. In some embodiments, the rate matcher 410 may not transmit predetermined bits of '0' in the coded output bit sequence x 409. In the puncturing process, the rate matcher 410 may puncture predetermined bits in the output bit sequence x 409 of the encoding input sequence mapper 406 and not transmit the punctured bits. Based on the position of a predetermined bit not transmitted in the output bit sequence x 409, the rate matcher 410 may map the frozen bit to zero-capacity bits incapable of delivering information in the input bit sequence u 407 of the polar code.

Output bits 411 of the rate matcher 410 are inputted to the segment concatenator 412, and coded segments are concatenated to output d={$d_0, d_1, \ldots d_{B-1}$} 413. If necessary, in addition to concatenation of the output bit sequences 411 of the rate matcher 410, padding of predetermined bits, e.g., zero bits, may be performed. For example, zero bits may be padded so that B satisfies a multiple of the modulation symbol order. The B value is the number of bits by which the information bit sequence is transmitted in the system, and may be a predetermined value based on the code rate or the number of modulation symbols.

The above-described encoding process of the polar code is exemplary only. Based on the requirements and characteristics of the system, a part of the process may be omitted, or any additional operation may be added.

Figure 5:
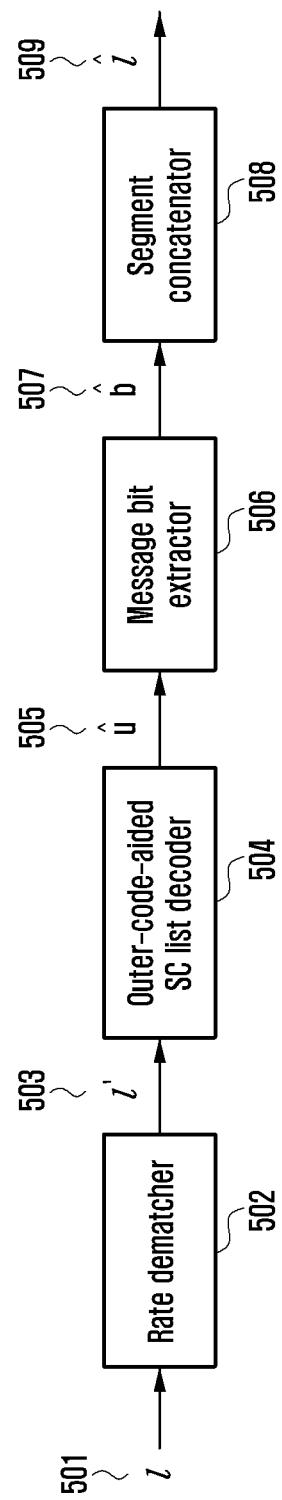
FIG. 5 illustrates a functional configuration of a reception-end apparatus that performs decoding in a wireless communication system according to various embodiments of the disclosure.

FIG. 5 illustrates a functional configuration of a reception-end apparatus that performs decoding in a wireless communication system according to various embodiments of the disclosure. The configuration shown in FIG. 5 may be understood as a part of the communication circuit 310 of the reception-end apparatus 120 shown in FIGS. 1 and 3.

Referring to FIG. 5, the reception-end apparatus 120 may include a rate dematcher 502, a polar decoder (or an outer-code-aided SC list decoder) 504, a message bit extractor 506, and a segment concatenator 508.

In some embodiments, some of the above components may be omitted or any other component may be added, based on system requirements or the like.

Although not explicitly disclosed herein, the reception-end apparatus 120 may include a demodulated log-likelihood ratio (LLR) generator in some embodiments. The demodulated LLR generator may demodulate a received signal and obtain an LLR corresponding to bits c transmitted from the transmission-end apparatus. In some embodiments, an LLR sequence corresponding to the transmission bit sequence c may be expressed as l={$l_0, l_1, \ldots l_{B-1}$}.

The rate dematcher 502 inversely performs the rate matching process of the transmission-end apparatus 110 in order to input the LLR sequence l' 503 generated through the demodulated LLR generator into the polar decoder 504. That is, the rate dematcher 502 may perform an inverse process of the rate matching performed by the transmission-end apparatus 110 in order to input the LLR sequence l 501 of a length E into the polar decoder 504 having a mother code of a length N. In some embodiments, when puncturing occurs in the rate matcher 410 of the transmission-end apparatus 110, the rate dematcher 502 may determine the LLR value for the punctured bit to be zero. In some embodiments, when shortening occurs in the rate matcher 410 of the transmission-end apparatus, the rate dematcher 502 may determine the LLR value for the shortened bit to be the maximum value of the LLR value corresponding to the bit value 0. In some embodiments, when repetition occurs for a particular bit, the rate dematcher 502 may combine all of the corresponding LLR values and thereby determine the LLR value for the bit where the repetition occurs. In some embodiments, an LLR sequence of a length N determined through the above process may be referred to as $$l' = \{l'_0, l'_1, \ldots, l'_{N-1}\}. \qquad 503$$

The polar decoder (or outer-code-aided SC list decoder) 504 may decode the LLR sequence 503, generated by the rate dematcher 502, through a decoding technique based on SC of a polar code. For example, the polar decoder 504 may perform the polar code SC-based decoding with respect to the LLR sequence 503 of a length N generated through the rate dematcher 502. In various embodiments, the SC-based decoding technique may include an SCL decoding technique or an SCS decoding technique. Various embodiments to be described below may be implemented in consideration of the SCL decoding. However, the disclosure is not limited to a specific decoding technique such as the SCL decoding technique. In some embodiments, when there are one or more concatenated outer codes, the polar decoder 504 may improve the SCL decoding performance by using a parity bit of the concatenated outer code during or after the SCL decoding. In some embodiments, through the above-described decoding, the polar decoder 504 may output an estimated value û 505 of the encoding input bit sequence u' from the transmission-end apparatus 110.

The message bit extractor 506 may extract a message bit at a predetermined position from the estimated value 505 of the encoding input bit sequence 505 outputted from the polar decoder 504. That is, the message bit extractor 506 may obtain a message bit at a predetermined position from the estimated encoding input bit sequence û 505. A message bit sequence extracted through the operation of the message bit extractor 506 may be referred to as b̂ 507.

The segment concatenator 508 inversely performs the segment process of the transmission-end apparatus 110. The segment concatenator 508 concatenates the output bits 507 of the message bit extractor 506, based on whether or not the segmentation is performed from the message bits of the predetermined position outputted from the message bit extractor 506. The segment concatenator 508 thus may output the concatenated output bits 509.

The above-described decoding process of the polar code is exemplary only. Based on the requirements and characteristics of the system, a part of the process may be omitted, or any additional operation may be added.

Figure 6:
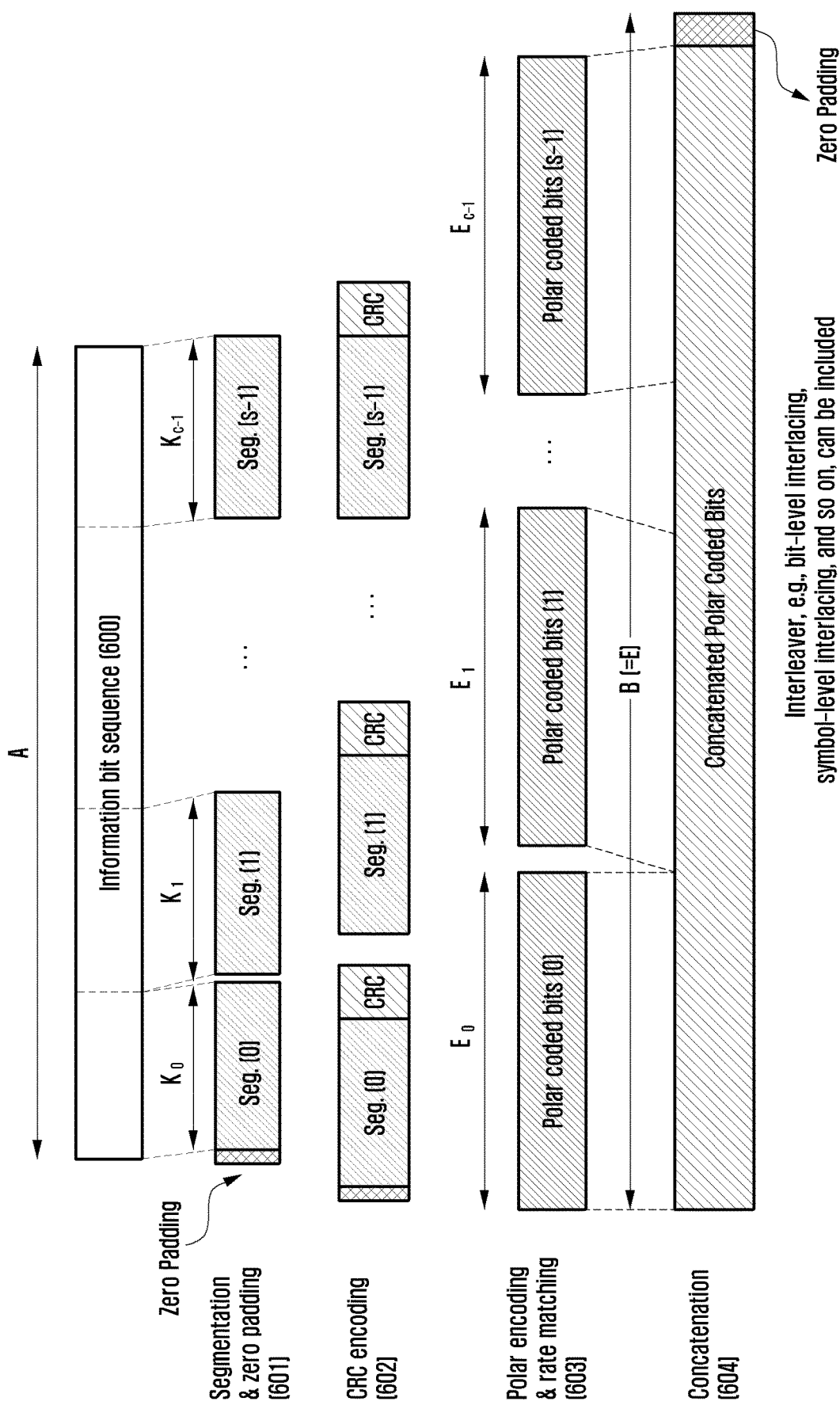
FIG. 6 is a diagram illustrating a polar coding process in a wireless communication system according to various embodiments of the disclosure.

FIG. 6 is a diagram illustrating a polar coding process in a wireless communication system according to various embodiments of the disclosure.

Referring to FIG. 6, now, the polar coding process will be described in more detail with reference to FIG. 6. FIG. 6 shows a polar coding method considering segmentation. When it is determined that segmentation is required according to a predetermined condition, an information bit sequence 600 is segmented into C segments (601). The length of each i-th segment ($0 \leq i < C$) is denoted by $K_i$ and determined by a predetermined method. Each i-th segment is subjected to outer coding, e.g., CRC encoding (602). The outer-coded output bit sequence is polar-coded through polar encoding and rate matching (603). The polar coded segments are concatenated to finally generate a concatenated polar coded bit sequence (604). The length E of the concatenated polar coded bit sequence may be $$E = \left\lceil \sum_{i=0}^{C-1} E_i / m \right\rceil \times m$$

to satisfy a multiple of the order of modulation symbols, and zero may be padded by $$\left( E - \sum_{i=0}^{C-1} E_i \right)$$

after concatenation of the polar coded bit sequence. The above length E is the same as the output bit sequence length B of the segment concatenator shown in FIG. 4. Also, the length E may be a predetermined value obtained by converting the number of modulation symbols for transmission of the input bit sequence into the number of bits. In one example, the number of modulation symbols for transmission of the input bit sequence may be predetermined by a given condition. In another example, it may be determined based on a predetermined code rate. Therefore, the number of encoding bits $E_i$ of each segment and the number of zero padding bits may be determined, if necessary, based on the predetermined E, the presence or absence of segments, and the number of segments.

Hereinafter, a condition for performing segmentation, which is an operation of the segmentation 402, and a method for determining the number of segments will be described in detail.

Figure 7:
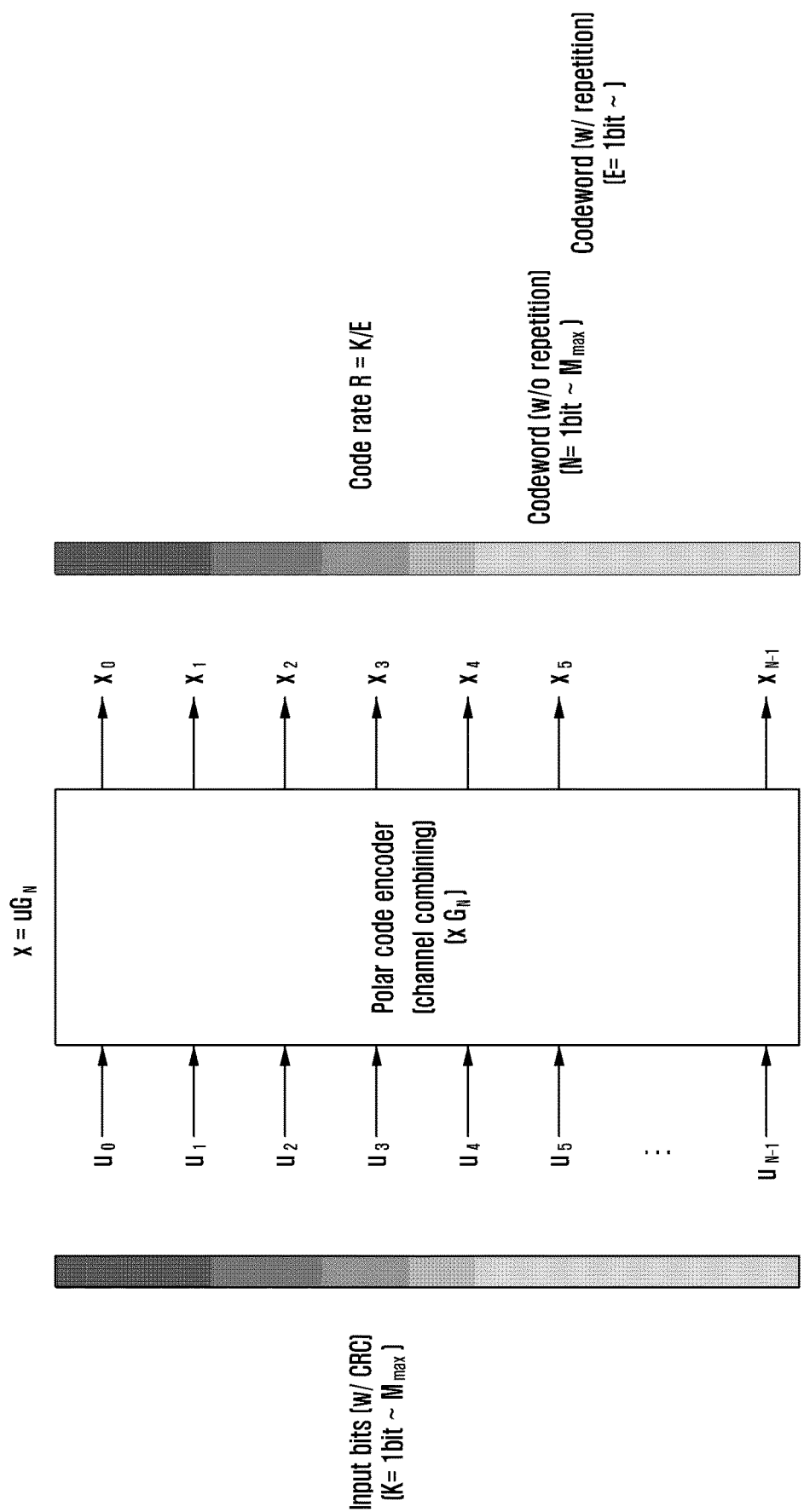
FIG. 7 is a diagram illustrating polar coding and segmentation in a wireless communication system according to various embodiments of the disclosure.

FIG. 7 is a diagram illustrating polar coding and segmentation in a wireless communication system according to various embodiments of the disclosure.

Referring to FIG. 7, first, an encoding method of the polar code and a need for segmentation will be described with reference to FIG. 7. In FIG. 7, the polar encoder, an input bit sequence $u=\{u_0, u_1, \ldots u_{N-1}\}$ of the polar encoder, and an output bit sequence $x=\{x_0, x_1, \ldots x_{N-1}\}=uG_N$ of the polar encoder are shown. When the above N is larger, the encoding/decoding complexity is increased. Thus, the maximum value $N_{max}$ of N needs to be set. The lengths N of the input bit sequence and the output bit sequence are determined by a predetermined method according to the length of the information bit sequence, the code rate, and the codeword length. The length N of the output bit sequence cannot be greater than the predetermined $N_{max}$. In some embodiments, when the codeword length E is greater than the mother code size N of the polar code, repetition is needed. In case of repetition, there is a limit to obtain an encoding performance gain. Thus, when the codeword length E is larger, segmentation is performed and respective segments are encoded with different codewords to reduce the number of repeated bits and thereby improve performance. When the length of the input bit is small, performance degradation due to repetition does not occur. Therefore, even though the value of E is larger in case of a small length of the input bit, the performance may be better when the segmentation is not performed.

Figure 8:
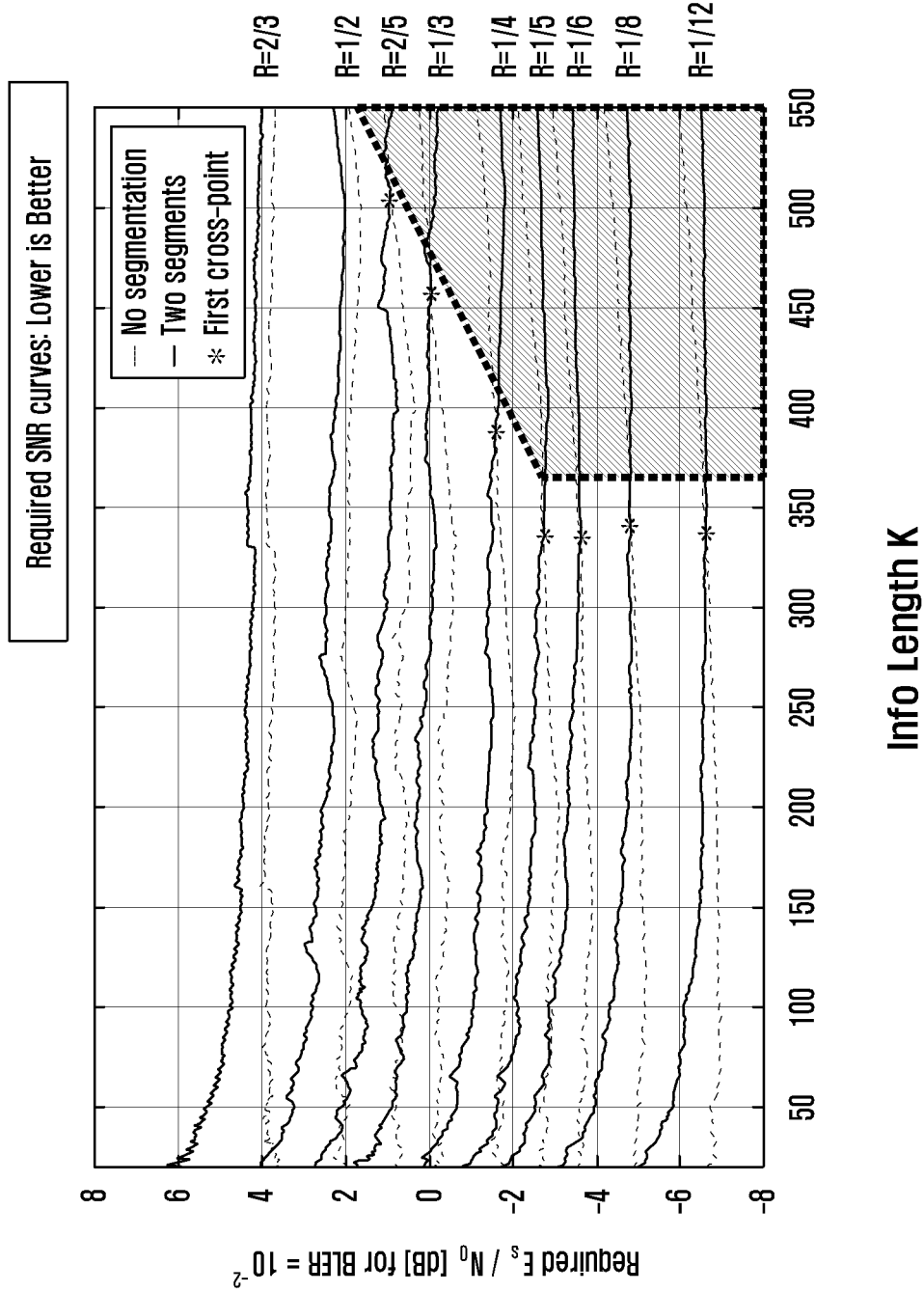
FIG. 8 is a diagram illustrating decoding performance in a wireless communication system according to various embodiments of the disclosure.

FIG. 8 is a diagram illustrating decoding performance in a wireless communication system according to various embodiments of the disclosure.

Referring to FIG. 8, FIG. 8 shows required $E_b/N_o$ for a decoding error probability of $10^{-2}$ with respect to the input bit length from 1 to 550 in case of performing segmentation according to each coding rate and in case of performing no segmentation. As shown in FIG. 8, when the length of the information bit sequence is larger than a specific length (e.g., 360), and when the codeword length is larger than a specific length (e.g., 1088), performing the segmentation has better decoding performance than performing no segmentation.

Therefore, when $A \geq A_{th}$ and $E \geq E_{th}$, segmentation with two segments is performed, and each segment is CRC-coded and polar-coded. For example, in the 3GPP Release-15 NR where $N_{max}$ is 1024, $A_{th}$ is 360 and $E_{th}$ is 1088.

As mentioned above, because the encoding/decoding complexity is increased when the N is larger, the N cannot exceed the predetermined $N_{max}$ in consideration of the performance and complexity of the system. When the sum of the information bit length A and the number of parity bits of outer coding (e.g., the number of CRC bits, $n_{crc}$) is greater than $N_{max}$, it is needed to perform segmentation.

Further, in order to improve the performance of the system, various segmentation criteria and the number of segments may be set as in the following embodiments.

It is possible to determine the number of segments, C, based on the length, A, of the information bit sequence and the number, E, of codeword bits, as follows.

First Embodiment

---

$c = C_{max}$
while $c \geq 1$
    if $\{A \geq f_{th,c}(A_{th,c}, c)$ and $E \geq g_{th,c}(E_{th,c}, c)\}$ or $A \geq h_{th,c}(N_{max}, c)$
        C = c
    end
    else c = c − 1
end

---

In the above, A denotes the length of the input bit sequence, and E denotes the number of polar encoding bits, i.e., the bit length after concatenation of coded segments (including a padding bit, if necessary) when segmentation is required. The above $f_{th,c}(A_{th,c}, c)$ is a function having, as input values, $A_{th,c}$ which is a threshold value related to the length of an information bit sequence for determining the necessity of segmentation and the number of segments, and the number, c, of segments. The $A_{th,c}$ may vary depending on the number, c, of segments. Also, the function $f_{th,c}$ may vary depending on the number, c, of segments. The above $g_{th,c}(E_{th,c}, c)$ is a function having, as input values, $E_{th,c}$ which is a threshold value related to the length of a polar encoding bit sequence for determining the necessity of segmentation and the number of segments, and the number, c, of segments. The function $g_{th,c}$ may also vary depending on the number, c, of segments. The above $h_{th,c}(N_{max}, c)$ is a function having, as input values, the maximum size of the mother code and the number, c, of segments. The function $h_{th,c}$ may also vary depending on the number of segments c.

Hereinafter, detailed embodiments will be described. The number of codeword transmission bits, E, is a value determined based on the number of modulation symbols for transmission of an input bit sequence coded, and the number of modulation symbols may be determined depending on a transmission method. For example, when an input bit sequence is uplink control information (UCI) and multiplexed with other UCI or data bits, and when E is smaller than the $E_{th}$ bit according to the priority of the modulation symbol mapping, but A is larger than the sum of the maximum value of the mother code and the number of CRC code parity bits, segmentation is required. When the length of the input bit sequence is larger than the length excluding the number of parity bits of the outer code from the maximum length of the mother code, and when segmentation is not performed, the polar encoding cannot be performed because the sum of the length of the input bit sequence and the parity bits of the outer code are larger than the maximum length of the mother code.

In the second embodiment, the segmentation is performed in the following cases.

Second Embodiment

When $A \geq A_{th}$ and $E \geq E_{th}$, or when $A \geq (N_{max}-n_{out})$, the segmentation is performed. In this case, the number of segments is two.

In the above, A denotes the length of the input bit sequence, and E denotes the number of polar encoding bits, i.e., the bit length after concatenation of coded segments (including a padding bit, if necessary) when segmentation is required. Also, $N_{max}$ denotes the maximum length of the mother code, and $n_{out}$ denotes the number of parity bits of the outer code, e.g., the number of CRC bits. In another embodiment, it may be the sum of the CRC code and the parity check (PC) bit. For example, when $A_{th}$ is 360, $E_{th}$ is 1088, $N_{max}$ is 1024, and $n_{out}$ is 11, whether to perform segmentation is determined and also the number of segments, i.e., the number of polar codes, is determined by the following condition.

When $A \geq 360$ and $E \geq 1088$, or when $A \geq (1024-11)=1013$, the segmentation is performed. In this case, the number of segments is two.

In the second embodiment, $A \geq (N_{max}-n_{out})$ related to the input bit sequence length may be changed to $A \geq \alpha \cdot (N_{max}-n_{out})$. Here, $\alpha$ is a number is smaller than or equal to 1, and it is possible to consider the maximum code rate transmittable when the length of the input bit sequence is the maximum. The condition, $A \geq (N_{max}-n_{out})$, is needed when the code rate is very high at the maximum length because $A \geq (N_{max}-n_{out})$ but $E<E_{th}$. Therefore, when $E<E_{th}$ and the code rate is very high, the maximum length of the input bit sequence may be limited.

In the above embodiments, the number of segments, that is, the number of code words is two. Hereinafter, various embodiments are described.

A method for determining the number of segments and whether to perform segmentation, based on a predetermined reference value according to the number of segments is described.

Third Embodiment

When $A \geq (C-1) \times A_{th,C}$ and $E \geq (C-1) \times E_{th,C}$, or when $A \geq (C-1) \times (N_{max}-n_{out})$, the segmentation is performed. In this case, the number of segments is C.

In the above, A denotes the length of the input bit sequence, and E denotes the number of polar encoding bits, i.e., the bit length after concatenation of coded segments (including a padding bit, if necessary) when segmentation is required. Also, $N_{max}$ denotes the maximum length of the mother code, and $n_{out}$ denotes the number of parity bits of the outer code, e.g., the number of CRC bits. In another embodiment, it may be the sum of the CRC code and the PC bit.

In the third embodiment, the condition, $A \geq (C-1) \times (N_{max}-n_{out})$, may be omitted in some cases, for example, when the maximum length of the input bit sequence is smaller than $(N_{max}-n_{out})$.

More specifically, the fourth embodiment is described hereinafter.

Fourth Embodiment

```
if A ≥ 360 × 3 and E ≥ 1088 × 3
    number of segment C = 4
else if A ≥ 360 × 2 and E ≥ 1088 × 2
    number of segment C =3
else if A ≥ 360 and E ≥ 1088
    number of segment C = 2
else
    number of segment C =1
end
```

In the above, A denotes the length of the input bit sequence, and E denotes the number of polar encoding bits, i.e., the bit length after concatenation of coded segments (including a padding bit, if necessary) when segmentation is required.

Figure 9:
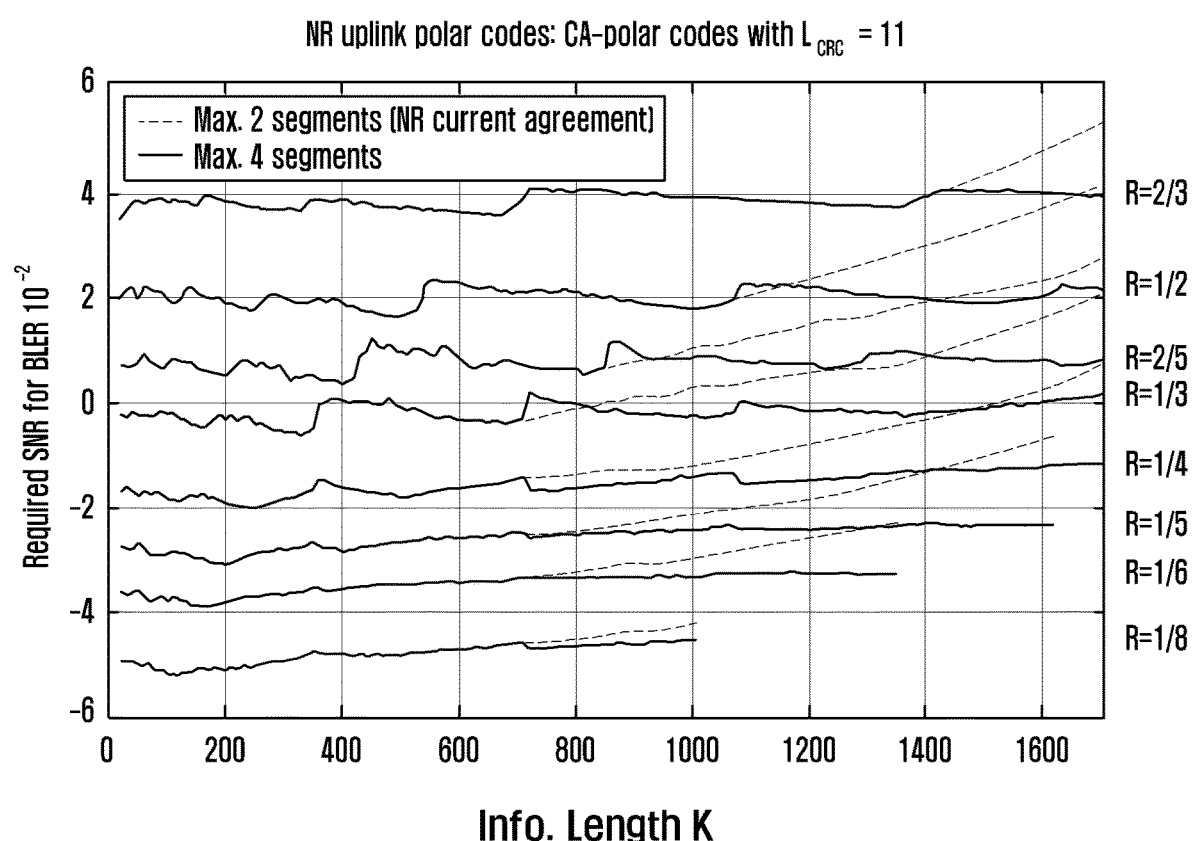
FIG. 9 is a diagram illustrating performance variations at various code rates in a wireless communication system according to various embodiments of the disclosure.

FIG. 9 is a diagram illustrating performance variations at various code rates in a wireless communication system according to various embodiments of the disclosure.

Referring to FIG. 9, FIG. 9 shows a signal-to-noise ratio (SNR) satisfying a block error rate (BLER)=$10^{-2}$ in the additive white Gaussian noise (AWGN) channel with respect to code rates ⅔, ½, ⅖, ⅓, ⅕, ⅙, and ⅛ when the length of the information bit sequence ranges from 20 bits to 1600 bits. The dotted line represents the performance when the maximum number of segments is limited to 2, and the solid line indicates the third embodiment in which the maximum number of segments is 4. As shown in FIG. 9, when the information word length is larger or the code rate is lower, that is, when the codeword length is larger, the same error probability may be achieved by using lower SNR when using the third embodiment. Therefore, when the information word length is larger or the code rate is lower, that is, when the codeword length is larger, suitably determining the number of segments and performing segmentation can improve the performance of the system. The improvement in the performance of the system means that because the use of the third embodiment can achieve a lower error probability based on the same SNR when using the same code rate, it is possible to use a higher code rate and send more information. Also, because a lower SNR is required when the same error is achieved by using the same code rate, it is possible to transmit the same data to a wider area.

In case of considering the maximum mother code, $N_{max}$, and the parity length of the outer code, $n_{out}$, in the fourth embodiment, the condition and the number of segments may be determined as in the fifth embodiment below.

Fifth Embodiment

```
if A ≥ 360 × 3 and E ≥ 1088 × 3 } or A ≥ 3 × (1024 − 11) = 3039
    number of segment C = 4
```

```
else if {A ≥ 360 × 2 and E ≥ 1088 × 2} or A ≥ 2 × (1024 − 11) = 2026
    number of segment C =3
else if {A ≥ 360 and E ≥ 1088} or A ≥ 1 × (1024 − 11) = 1013
    number of segment C = 2
else
    number of segment C =1
end
```

In the above, A denotes the length of the input bit sequence, and E denotes the number of polar encoding bits, i.e., the bit length after concatenation of coded segments (including a padding bit, if necessary) when segmentation is required. Also, $N_{max}$ denotes the maximum length of the mother code, and $n_{out}$ denotes the number of parity bits of the outer code, e.g., the number of CRC bits. In another embodiment, it may be the sum of the CRC code and the PC bit.

When the number of segments is generalized, it is possible to determine whether to perform segmentation and also determine the number of segments, based on the sixth and seventh embodiments.

Sixth Embodiment

```
c = C_max
while c ≥ 1
    if {A ≥ A_th × (c − 1) and E ≥ E_th × (c − 1) }
        C = c
    end
    else c = c − 1
end
```

Seventh Embodiment

```
c = C_max
while c ≥ 1
    if {A ≥ A_th × (c − 1) and E ≥ E_th × (c − 1) } or ≥ (N_max − n_out) ×
    (c − 1)
        C = c
    end
    elsec = c − 1
end
```

In the above, A denotes the length of the input bit sequence, and E denotes the number of polar encoding bits, i.e., the bit length after concatenation of coded segments (including a padding bit, if necessary) when segmentation is required. Also, $N_{max}$ denotes the maximum length of the mother code, and $n_{out}$ denotes the number of parity bits of the outer code, e.g., the number of CRC bits. In another embodiment, it may be the sum of the CRC code and the PC bit.

The method of determining the segmentation criterion and the number of segments may be varied depending on one of the following parameters. The reference points may be varied depending on the maximum mother code size. Because the length of repetition causing performance deterioration and the ratio of the repetition length to the mother code size are varied depending on the mother code size, the criterion for determining whether to perform segmentation and determining the number of segments may be varied according to the maximum size of the mother code. Also, the criterion for determining whether to perform segmentation and determining the number of segments may be varied according to at least one parameter of a use case, a service scenario, a channel type (physical downlink control channel (PDCCH), physical downlink shared channel (PDSCH), physical uplink control channel (PUCCH), or physical uplink shared channel (PUSCH)), and information bit sequence type. In addition, because the ratio of necessary repetition bits to the maximum size of the mother code may be changed according to the maximum value of the number of codeword bits (E in FIG. 6) after rate matching, the criterion for determining whether to perform segmentation and determining the number of segments may be varied according to the number of codeword bits after rate matching. When the maximum codeword size differs according to at least one parameter of a use case, a service scenario, a channel type (PDCCH, PDSCH, PUCCH, or PUSCH), and information bit sequence, the segmentation criterion may be varied.

Figure 10:
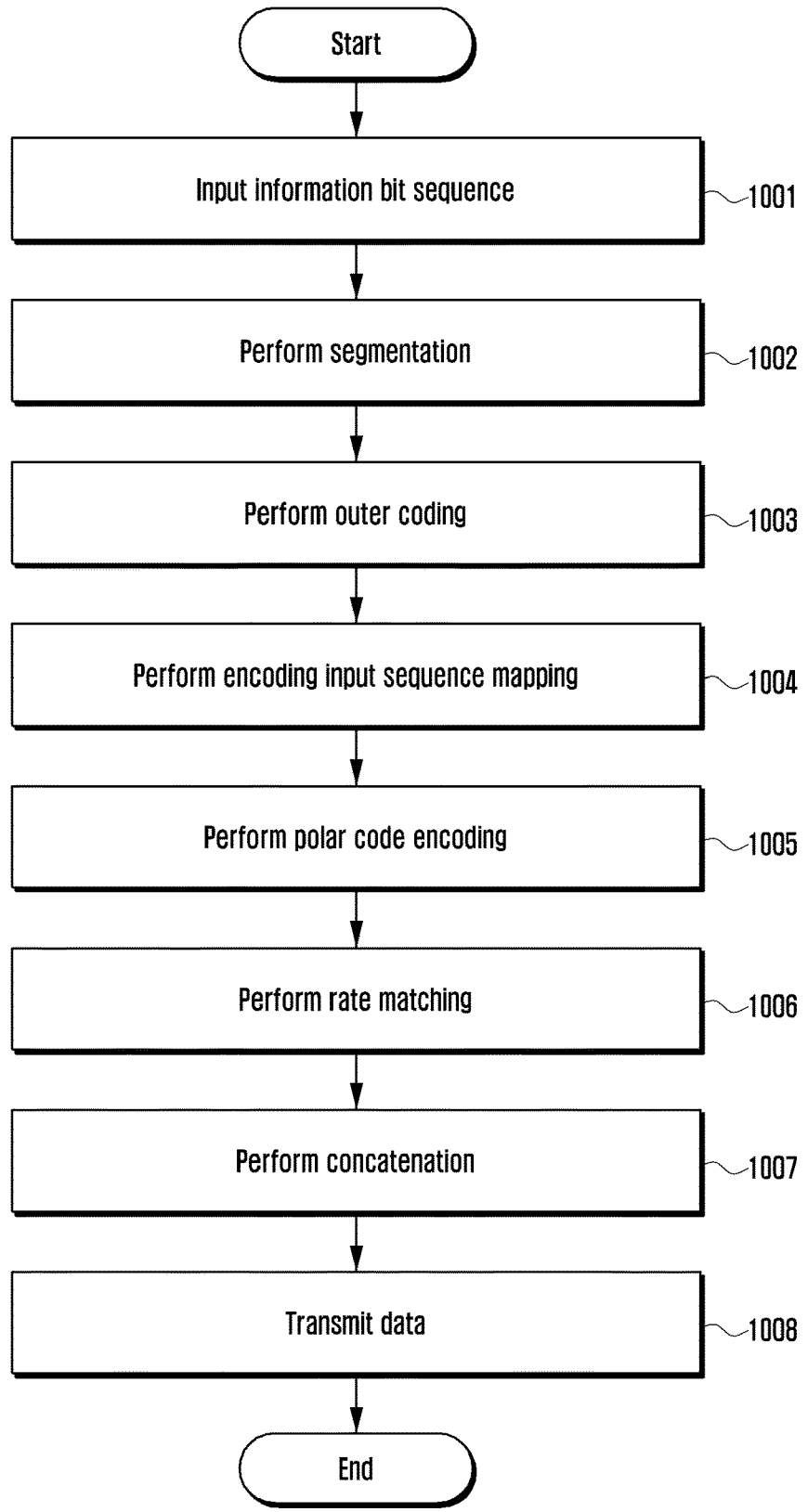
FIG. 10 illustrates a flow diagram of a transmission-end apparatus that performs encoding by using a polar code in a wireless communication system according to various embodiments of the disclosure.

FIG. 10 illustrates a flow diagram of a transmission-end apparatus that performs encoding by using a polar code in a wireless communication system according to various embodiments of the disclosure. FIG. 10 shows an operation method of the transmission-end apparatus 110 of FIG. 1. Operations 1003 to 1008 of FIG. 10 to be described below correspond to operations of the above-described components 402 to 412 of FIG. 4, respectively.

Referring to FIG. 10, at operation 1001, the transmission-end apparatus inputs a sequence of information bits.

At operation 1002, the transmission-end apparatus performs segmentation, based on whether to perform segmentation, and based on the number of segments which are determined according to various embodiments of the disclosure.

At operation 1003, the transmission-end apparatus performs outer coding on each of the segments. That is, the transmission-end apparatus may encode the input bit sequence to improve the performance of the ML-like decoder. In some embodiments, the outer code used for outer coding may include an error detection code such as a CRC code or an error correction code such as a BCH code and a parity check code. In some embodiments, the outer coding process may be omitted depending on the performance and type of the system.

At operation 1004, the transmission-end apparatus performs encoding input sequence mapping. For example, the transmission-end apparatus may map the information bit sequence to an encoding input bit sequence of a polar code, based on the number of information bits, the specific sub-channel order based on sub-channel characteristics of the polar code, the number of transmission bits, a rate matching method, and the like.

At operation 1005, the transmission-end apparatus performs polar code encoding. That is, the transmission-end apparatus may perform encoding of the polar code, based on the encoding input bit sequence to which the information bit sequence is mapped. In some embodiments, the encoding of the polar code may be performed by multiplying the encoding input bit sequence by a generator matrix.

At operation 1006, the transmission-end apparatus performs rate matching. For example, the transmission-end apparatus may perform the rate matching by performing puncturing, shortening, or repetition, based on the number of information bits and the number of transmission bits.

At operation 1007, the transmission-end apparatus performs a concatenation on the segments. When no segmentation is performed, the operation 1007 may not be performed.

At operation 1008, the transmission-end apparatus performs data transmission. That is, the transmission-end apparatus may modulate the rate-matched bit sequence and transmit it to a reception-end apparatus.

Figure 11:
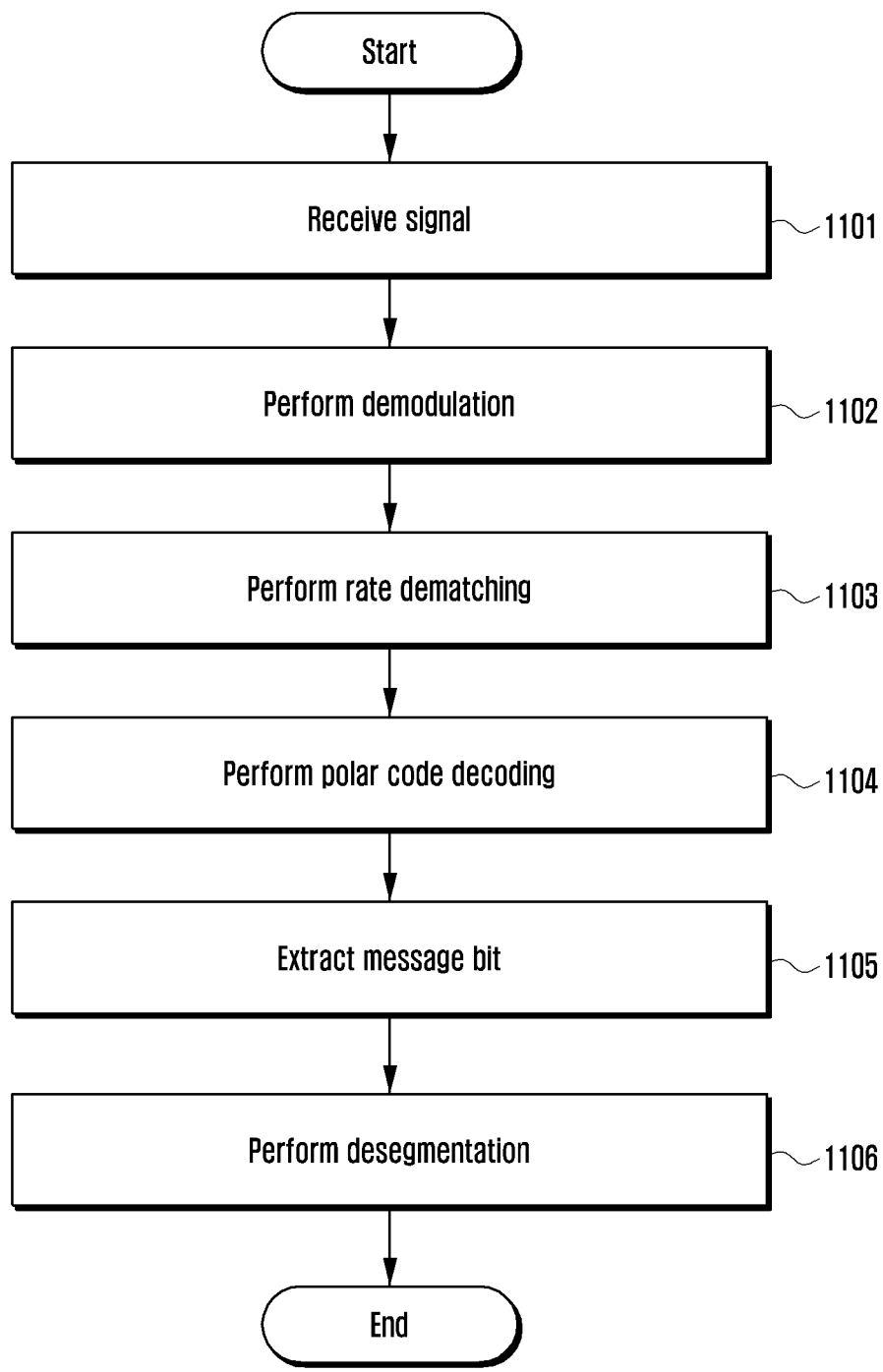
FIG. 11 illustrates a flow diagram of a reception-end apparatus that performs decoding by using a polar code in a wireless communication system according to various embodiments of the disclosure.

FIG. 11 illustrates a flow diagram of a reception-end apparatus that performs decoding by using a polar code in a wireless communication system according to various embodiments of the disclosure. FIG. 11 shows an operation method of the reception-end apparatus 120 of FIG. 1. Operations 1101 to 1106 of FIG. 11 to be described below correspond to operations of the above-described components 502 to 508 of FIG. 5, respectively.

Referring to FIG. 11, at operation 1101, the reception-end apparatus receives a signal. That is, the reception-end apparatus may receive encoded signals through a channel from a transmission-end apparatus.

At operation 1102, the reception-end apparatus performs demodulation. In some embodiments, the reception-end apparatus may demodulate the received signal and, based on the received signal, determine an LLR value which is a logarithm ratio between a probability that the value of a bit transmitted by the transmission-end apparatus was zero and a probability that it was one.

At operation 1103, the reception-end apparatus performs rate dematching. That is, the reception-end apparatus may inversely perform a rate matching process performed by the transmission-end apparatus before performing polar code decoding. For example, the reception-end apparatus may determine an LLR value corresponding to related bits according to a puncturing, shortening, or repetition technique determined based on the number of input bits and the number of transmission bits.

At operation 1104, the reception-end apparatus performs the polar code decoding. For example, the reception-end apparatus may output an estimated value for the encoding input bit sequence through SC-based decoding based on the LLR value determined through the rate dematching process. In some embodiments, the SC-based decoding technique may include an SCL or SCS decoding technique.

At operation 1105, the reception-end apparatus performs message bit extraction. For example, the reception-end apparatus may extract a message bit at a predetermined position from the estimated value of the encoding input bit sequence outputted through the polar code decoding.

At operation 1106, the reception-end apparatus performs desegmentation, based on whether the segmentation is performed, and based on the number of segments according to various embodiments of the disclosure.

Referring to the above descriptions about FIGS. 1 to 11, the apparatus and method according to various embodiments of the disclosure may change a specific parameter to define encoding of the transmission-end apparatus and decoding of the reception-end apparatus when performing the encoding and decoding of the polar code by using a concatenated outer code including a parity check bit.

Figure 12:
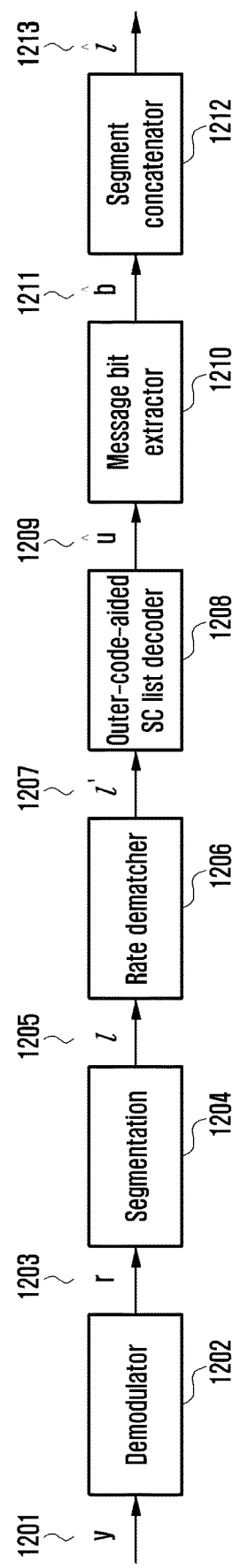
FIG. 12 illustrates a functional configuration of a reception-end apparatus that performs decoding in a wireless communication system according to various embodiments of the disclosure.

FIG. 12 illustrates a functional configuration of a reception-end apparatus that performs decoding in a wireless communication system according to various embodiments of the disclosure. The configuration shown in FIG. 12 may be understood as a part of the communication circuit 310 of the reception-end apparatus 120 shown in FIGS. 1 and 3.

Referring to FIG. 12, the reception-end apparatus 120 may include a demodulator 1202, a segmentation 1204, a rate dematcher (or deratematcher) 1206, a polar decoder (or an outer-code-aided SC list decoder) 1208, a message bit extractor 1210, and a segment concatenator 1212 according to various embodiments of the disclosure.

In some embodiments, some of the above components may be omitted or any other component may be added, based on system requirements or the like.

The demodulator 1202 demodulates a received signal 1201 to obtain an LLR corresponding to a bit, d, transmitted from the transmission-end apparatus. In some embodiments, the LLR sequence corresponding to the transmission bit sequence, d, may be expressed as $r=\{r_0, r_1, \ldots, r_E\}$ 1203.

The segmentation 1204 obtains the LLR corresponding to the transmission bit sequence, c, based on whether the segmentation is performed in the transmission-end apparatus 110 and based on the number of segments, in order to input the LLR sequence 1203 generated through the demodulator 1202 into the rate dematcher 1206. In some embodiments, the LLR sequence corresponding to the transmission bit sequence, c, may be represented by $l=\{l_0, l_1, \ldots, l_E\}$ 1205. When the transmitted bit sequence is the i-th segment (0≤i<C), E is $E_i$. The $E_i$ is the number of polar coded bits of the i-th segment and may be determined according to a predetermined scheme. Whether the segmentation is performed and the number of segments can be determined based on the embodiments of the disclosure and operate accordingly.

The rate dematcher 1206 inversely performs the rate matching process of the transmission-end apparatus 110 in order to input the LLR sequence generated through the demodulated LLR generator into the polar decoder 1208. That is, the rate dematcher 1206 may perform an inverse process of the rate matching performed by the transmission-end apparatus 110 in order to input the LLR sequence l 1205 of a length E into the polar decoder 1208 having a mother code of a length N. In some embodiments, when puncturing occurs in the rate matcher 410 of the transmission-end apparatus, the rate dematcher 1206 may determine the LLR value for the punctured bit to be zero. In some embodiments, when shortening occurs in the rate matcher 410 of the transmission-end apparatus, the rate dematcher 1206 may determine the LLR value for the shortened bit to be the maximum value of the LLR value corresponding to the bit value 0. In some embodiments, when repetition occurs for a particular bit, the rate dematcher 1206 may combine all of the corresponding LLR values and thereby determine the LLR value for the bit where the repetition occurs. In some embodiments, an LLR sequence of a length N determined through the above process may be referred to as $$l' = \{l'_0, l'_1, \ldots, l'_{N-1}\}. \quad\quad 1207$$

The polar decoder (or outer-code-aided SC list decoder) 1208 may decode the LLR sequence 1207, generated by the rate dematcher 1206, through a decoding technique based on SC of a polar code. For example, the polar decoder 1208 may perform the polar code SC-based decoding with respect to the LLR sequence 1207 of a length N generated through the rate dematcher 1206. In various embodiments, the SC-based decoding technique may include an SCL decoding technique or an SCS decoding technique. Various embodiments described herein may be implemented in consideration of the SCL decoding. However, the disclosure is not limited to a specific decoding technique such as the SCL decoding technique. In some embodiments, when there is one or more concatenated outer codes, the polar decoder 1208 may improve the SCL decoding performance by using a parity bit of the concatenated outer code during or after the SCL decoding. In some embodiments, through the above-described decoding, the polar decoder 1208 may output an estimated value û 1209 of the encoding input bit sequence u' from the transmission-end apparatus 110.

The message bit extractor 1210 may extract a message bit at a predetermined position from the estimated value of the encoding input bit sequence outputted from the polar decoder 1208. That is, the message bit extractor 1210 may obtain a message bit at a predetermined position from the estimated encoding input bit sequence û 1209. A message bit sequence extracted through the operation of the message bit extractor 1210 may be referred to as b̂ 1211.

The segment concatenator 1212 inversely performs the segment process of the transmission-end apparatus 110. The segment concatenator 1212 concatenates the output bits of the message bit extractor 1210, based on the number of segments. The segment concatenator may thus output the concatenated segments 1213.

The above-described decoding process of the polar code is exemplary only. Based on the requirements and characteristics of the system, a part of the process may be omitted, or any additional operation may be added.

Figure 13:
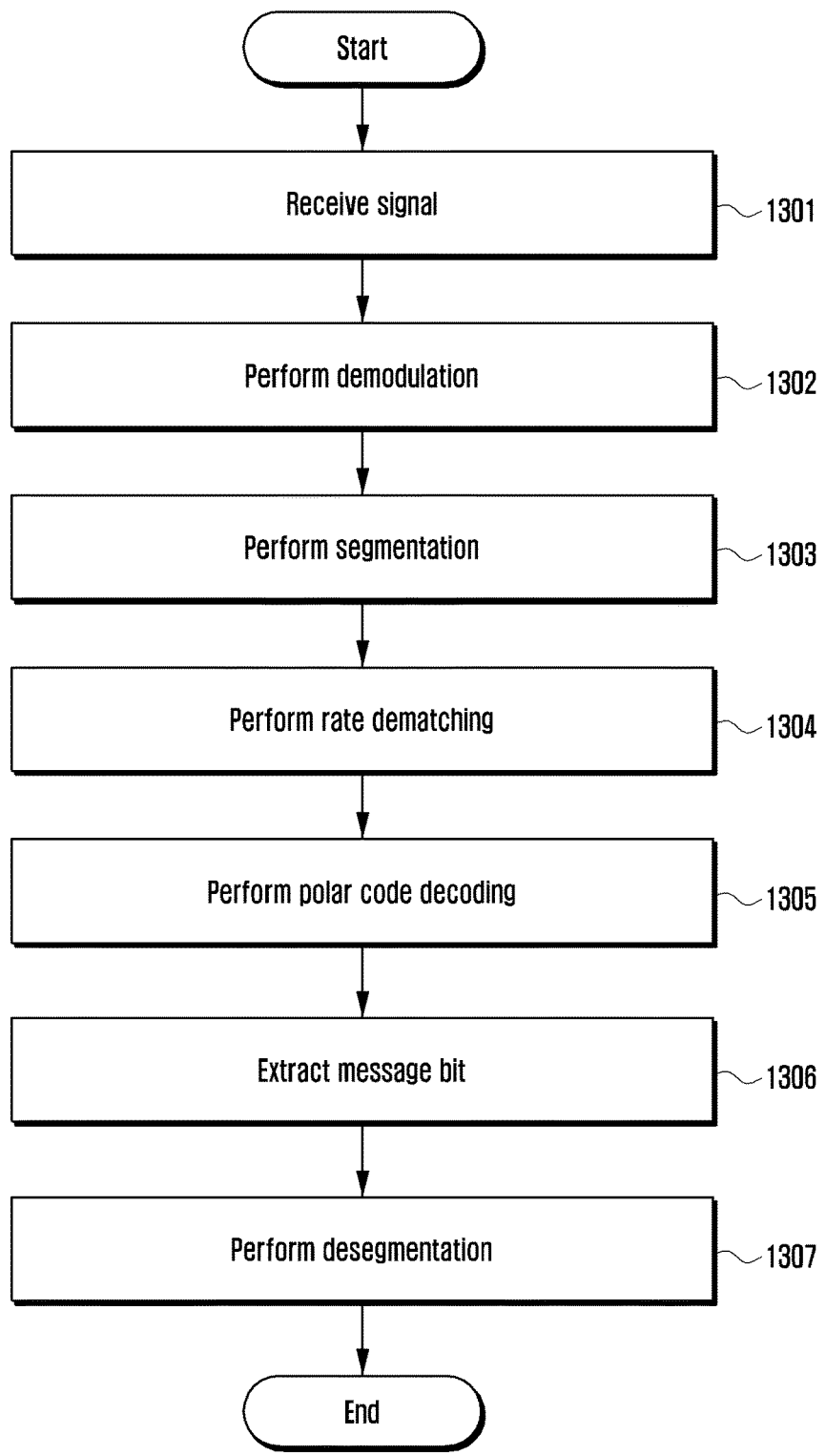
FIG. 13 illustrates a flow diagram of a reception-end apparatus that performs decoding by using a polar code in a wireless communication system according to various embodiments of the disclosure.

FIG. 13 illustrates a flow diagram of a reception-end apparatus that performs decoding by using a polar code in a wireless communication system according to various embodiments of the disclosure. FIG. 13 shows an operation method of the reception-end apparatus 120 of FIG. 1. Operations 1301 to 1307 of FIG. 13 to be described below correspond to operations of the above-described components 1202 to 1212 of FIG. 12, respectively.

Referring to FIG. 13, at operation 1301, the reception-end apparatus receives a signal. That is, the reception-end apparatus may receive encoded signals through a channel from a transmission-end apparatus.

At operation 1302, the reception-end apparatus performs demodulation. In some embodiments, the reception-end apparatus may demodulate the received signal and, based on the received signal, determine an LLR value which is a logarithm ratio between a probability that the value of a bit transmitted by the transmission-end apparatus was zero and a probability that it was one.

At operation 1303, the reception-end apparatus performs segmentation, depending on whether the segmentation is performed, and based on the number of segments. Whether or not the segments are segmented and the number of segments can be determined and operated are based on the embodiments of the disclosure.

At operation 1304, the reception-end apparatus performs rate dematching. That is, the reception-end apparatus may inversely perform a rate matching process performed by the transmission-end apparatus before performing polar code decoding. For example, the reception-end apparatus may determine an LLR value corresponding to related bits according to a puncturing, shortening, or repetition technique determined based on the number of input bits and the number of transmission bits.

At operation 1305, the reception-end apparatus performs the polar code decoding. For example, the reception-end apparatus may output an estimated value for the encoding input bit sequence through SC-based decoding based on the LLR value determined through the rate dematching process. In some embodiments, the SC-based decoding technique may include an SCL or SCS decoding technique.

At operation 1306, the reception-end apparatus performs message bit extraction. For example, the reception-end apparatus may extract a message bit at a predetermined position from the estimated value of the encoding input bit sequence outputted through the polar code decoding.

At operation 1307, the reception-end apparatus performs desegmentation, based on whether the segmentation is performed, and based on the number of segments according to various embodiments of the disclosure.

Referring to the above descriptions about FIGS. 12 and 13, the apparatus and method according to various embodiments of the disclosure may change a specific parameter to define encoding of the transmission-end apparatus and decoding of the reception-end apparatus when performing the encoding and decoding of the polar code by using a concatenated outer code including a parity check bit.

Meanwhile, embodiments described above with reference to FIGS. 1 to 13 can be applied to the following processes.

In the uplink transmission process of long term evolution (LTE)/LTE advanced (LTE-A), information bits transmitted on an uplink shared channel (UL-SCH) of a transmission channel are divided into units of a transport block (TB), and a TB CRC bit is added. Then, the TB+TB-CRC bits are divided into at least one code block (CB), and a CB-CRC is added. Then, the CB+CB-CRCs are mapped to a PUSCH by passing through procedures such as channel coding, rate matching (RM), and code block concatenation (CBC).

An uplink control channel (or UCI) of the transmission channel may be composed of UCI elements such as a hybrid automatic repeat request (HARQ) or rank indicator (RI), a channel state information (CSI) reference signal (CSI-RS) resource indicator (CRI), a precoding matrix indicator (PMI), and a channel quality indicator (CQI). Channel coding may be applied individually or through joint encoding of one or more UCI elements according to a predefined rule. The channel coding applied UCI may be multiplexed with the uplink data channel and transmitted on the PUSCH or on a PUCCH.

Meanwhile, in case of the NR system, CBs included in one TB may be divided into one or more code block groups (CBGs). In some cases, HARQ acknowledgment/non-acknowledgment (ACK/NACK) is reported for each CBG, so that retransmission of each CBG is possible. Excepting this, the uplink transmission process of the NR is similar to those of the LTE and LTE-A systems.

In the LTE, LTE-A, and NR systems, a terminal may measure a reference signal transmitted by a base station in downlink and, based on the measurement result, feed the generated UCI back to the base station. There are five types of UCI elements that the terminal feeds back.

CRI: Index of a CSI-RS resource preferred by a terminal among CSI-RSs transmitted by a base station RI: The number of spatial layers preferred by a terminal in the current channel state PMI: Indicator for a precoding matrix preferred by a terminal in the current channel state CQI: This means the maximum data rate that can be received by a terminal in the current channel state. The CQI may be replaced by a signal to interference plus noise ratio (SINR), a maximum error-correcting code rate and modulation scheme, data efficiency per frequency, etc. which can be utilized similar to the maximum data rate.

CSI reference signal received power (RSRP) or synchronization signal block (SSB) RSRP: This is the received power for X CSI-RS(s) designated by CRI or previously agreed (e.g., the highest received power). The SSB RSRP is the received power for X SSB(s) indicated by a base station or previously agreed (e.g., the highest received power). Here, the received power of the SSB may be defined as one of a primary SS (PSS), a secondary SS (SSS), or a physical broadcast channel (PBCH), or as an average received power of some or all of them.

In case of the NR, a periodic CSI reporting may be transmitted through a short PUCCH or a long PUCCH. The short PUCCH is a PUCCH format composed of one or two orthogonal frequency division multiplexing (OFDM) symbols, and the long PUCCH is a PUCCH format composed of three or more OFDM symbols. In the NR, only single-slot reporting is supported for the CSI reporting via the short PUCCH or long PUCCH, and multiplexing of CSI parameters (or UCI elements) between multiple slots as in the LTE and LTE-A is not supported. This can reduce multiple reporting time dependency on one CSI reporting and also prevent performance degradation due to error propagation.

In the NR system, three types of codebooks are supported. A terminal may be instructed to use one of three types of codebooks through upper layer signaling. The first type is a type I-single panel codebook that assumes a single panel and a low CSI feedback resolution. The second type is a type I-multi panel codebook that assumes multiple panels and a low CSI feedback resolution. The third type is a Type II codebook that assumes a single panel and a high CSI feedback resolution. Also, in the NR, each type of codebook may be set to one of two modes. The first mode is a mode in which one beam group contains one beam direction. In this case, i2 indicates only co-phasing information. The second mode is a mode in which one beam group contains one or more beam directions. In this case, i2 indicates both beam selection and co-phasing information.

In the NR, the Reed-Muller (RM) code is used for channel coding of downlink control information (DCI) or UCI information bits of 11 bits or less, and the polar code is used for channel coding of DCI or UCI information bits of 12 bits or more. The above information bits may be counted by including only the A-bit UCI bit stream or counted by including both the A-bit UCI bit stream and the L-bit parity bits.

Now, the polar code is further described. In the polar code encoding, information bits are encoded by a predetermined generation matrix and thereby converted to codeword. At this time, information bits may have different reliability. Therefore, it is possible to improve decoding performance by defining some of the bits with low reliability according to the order of reliability as a frozen bit, using a predetermined value and using the remainder as data bits.

Also, in the polar code encoding, it is possible to distinguish a bit index to be used as a frozen bit and a bit index to be used as a data bit according to a desired coding rate (CR) such as CR=⅓, CR=½, or CR=¾. This sequence of the index may be defined as a polar code sequence. Therefore, the above code rate means a code rate before rate matching is applied. That is, the number of coded bits is equal to the mother code size of the polar code. When sorting this polar code sequence according to the reliability of each bit, the polar code sequence is divided into a frozen bit part composed of bits having the lowest reliability, a data bit part composed of bits having intermediate reliability, and a CRC part having the highest reliability. In addition, the reliability of the data bit part and the CRC part may not be distinguished.

Next, the polar code decoding is described. The reception-end apparatus decodes a received signal based on the generation matrix for the defined polar code sequence. This decoding is performed in the reverse order of the reliability of each information bit by the reception-end apparatus composed of a plurality of basic decoding units. In each basic decoding unit, LLR calculation (check node operation) and successive cancelation (variable node operation) for corresponding node are sequentially and continuously performed.

A channel coding chain based on the polar code is now described. DCI or UCI is converted to a polar code input sequence (bit sequence) through a CRC encoder. The polar code input sequence is converted to a polar codeword through a polar code encoder, and then rate matching is performed. Then, if necessary, the rate-matched codeword is channel-interleaved in a circular buffer, modulated, and mapped to PDCCH or PUCCH.

In the NR system, for PDCCH and PUCCH channel encoding and decoding, the polar code is used for information payload. Hereinafter, the encoding and decoding processes based on the NR polar code will be described in detail.

A data/control stream received from a medium access control (MAC) layer or transmitted to the MAC layer is encoded or decoded to provide transport and control services after a radio transmission connection. The channel coding scheme based on the polar code is formed of a combination of error detection, error correction, rate matching, interleaving, and mapping to a physical channel CRC calculation process: In an input bit sequence $a_0, a_1, a_2, a_3, \ldots, a_{A-1}$ and parity bits $p_0, p_1, p_2, p_3, \ldots, p_{L-1}$, A denotes the size of input bit sequence, L denotes the number of CRC parity bits, and the parity bits are generated based on cyclic generator polynomial. The cyclic generator polynomial is defined by a standard specification. A bit sequence after the CRC parity bit addition becomes $b_0, b_1, b_2, b_3, \ldots, b_{B-1}$, and B=A+L.

Code block segmentation and code block CRC addition process: When segmentation is performed for the input bit sequence $a_0, a_1, a_2, a_3, \ldots, a_{A-1}$ of the code block segmentation, the number of segmented code blocks, C, is two. Otherwise, the number of code blocks is one. For each of the segmented code blocks, parity bits $p_{r0}, p_{r1}, p_{r2}, \ldots, p_{r(L-1)}$ are calculated according to the above-described CRC calculation process, and "r" denotes an index for identifying a segmented code block.

Channel coding process: Different coding schemes are applied to different types of transport channels (TrCH), and different coding schemes are applied to different control information. For example, the polar code is applied to the BCH, the polar code may be applied to the DCI transmitted on the PDCCH, and the polar code and the block code may be applied to the UCI transmitted on the PUCCH or PUSCH. For any code block, the bit sequence input into channel coding is $c_0, c_1, c_2, c_3, \ldots, c_{K-1}$, where "K" denotes the number of bits to be coded. The bit after encoding is $d_0, d_1, d_2, \ldots, d_{N-1}$, where $N=2^n$ and "n" is defined by the standard. In the channel coding process, the bit sequence $c_0, c_1, c_2, c_3, \ldots, c_{K-1}$ is interleaved and becomes $c'_0, c'_1, c'_2, c'_3, \ldots, c'_{K-1}$. The interleaved bits are encoded via the polar code, and the encoded output is $d=[d_0\ d_1\ d_2\ \ldots\ d_{N-1}]$. The interleaving may not be used under every condition. For example, interleaving may be used for the bit sequence transmitted on the BCH or PDCCH, and interleaving may not be used for the bit sequence transmitted on the PUCCH or PUSCH.

Rate matching process: The rate matching for the polar code is defined in units of code blocks and composed of sub-block interleaving, bit selection (collection), and bit interleaving. An input into rate matching is $d_0, d_1$, $d_2, \ldots, d_{N-1}$, and an output bit sequence after the rate matching is $f_0, f_1, f_2, \ldots, f_{E-1}$. The coded bits $d_0, d_1, d_2, \ldots, d_{N-1}$ inputted into the sub-block interleaver are divided into 32 sub-blocks. Output bits from the sub-block interleaver are $y_0, y_1, y_2, \ldots, y_{N-1}$, and sub-block-interleaved according to the procedure defined in the standard specification. The output $y_0, y_1, y_2, \ldots, y_{N-1}$ from the sub-block interleaver is written into the cyclic buffer of length N, and an output bit sequence of the bit selection becomes $e_k$. At this time, $k=0,1,2,\ldots,E-1$, where "E" denotes the length of the rate matching output sequence. The bit sequence $e_0, e_1, e_2, \ldots, e_{E-1}$ is bit-interleaved and then outputted as $f_0, f_1, f_2, \ldots, f_{E-1}$.

Code block concatenation process: An input bit sequence into the code block concatenation process is $f_{rk}$, where $r=0, \ldots, C-1$ and $k=0, \ldots, E_r-1$. Also, $E_r$ denotes the number of bits for which the rate matching is performed on the r-th code block. Output bits of the code block concatenation are $g_k$, where $k=0, \ldots, G-1$. The code block concatenation process is performed by sequentially concatenating the rate matching results for different code blocks.

Hereinafter, a process of applying the polar code when the UCI is transmitted on the PUCCH or PUSCH will be described.

A terminal generates a UCI bit sequence, and the UCI bit sequence may include HARQ-ACK and/or SR, only CSI, or HARQ-ACK and/or CSI. Code block segmentation and CRC addition are performed on the generated UCI bit sequence. In case where the payload size A is equal to or larger than 12, if $A \geq 360$ and $E \geq 1088$, $I_{seg}=1$, or if $A \geq 1013$, $I_{seg}=1$. In the other cases, $I_{seg}=0$. If $12 \leq A \leq 19$, the parity bits $p_{r0}, p_{r1}, p_{r2}, \ldots, p_{r(L-1)}$ are calculated by setting L to 6 bits, and if $A \geq 20$, the parity bits $p_{r0}, p_{r1}, p_{r2}, \ldots, p_{r(L-1)}$ are calculated by setting L to 11 bits. When $I_{seg}=1$, it means that the segmentation is performed with two segments. When $I_{seg}=0$, it means that segmentation is not performed. The above "E" denotes a predetermined value and is defined in the standard, based on the number of resource elements (REs) for transmission of UCI, the number of layers, the modulation order, and the like. The predetermined E value is expressed as $E_{UCI}$.

Information bits $c_{r0}, c_{r1}, c_{r2}, c_{r3} \ldots, c_{r(K_r-1)}$ are delivered to the channel coding block, where "r" denotes the code block number, and $K_r$ denotes the number of bits contained in the code block number "r." The total number of code blocks is C, and each code block is independently coded. The bits encoded through the polar coding are $d_{r0}, d_{r1}, d_{r2}, d_{r3} \ldots, d_{r(N_r-1)}$, where $N_r$ is the number of coded bits contained in the code block "r." The total number of the code blocks, C, is 2 in case of $I_{seg}=1$, and is 1 in case of $I_{seg}=0$. The number of the code blocks, C, is expressed as $C_{UCI}$.

An input bit sequence into the rate matching is $d_{r0}, d_{r1}, d_{r2}, d_{r3} \ldots, d_{r(N_r-1)}$, and the rate matching is performed together with bit interleaving by setting $I_{BIL}=1$. The length of a rate matching output sequence is $E_r = \lfloor E_{UCI}/C_{UCI} \rfloor$, where $C_{UCI}$ is the number of code blocks for UCI and is defined together with $E_{UCI}$ by the standard specification. An output bit sequence of the rate matching is $f_{r0}, f_{r1}, f_{r2}, \ldots, f_{r(E_r-1)}$, where $E_r$ is the length of the rate matching output sequence of the code block "r."

An input bit sequence into the code block concatenation block is $f_{r0}, f_{r1}, f_{r2}, \ldots, f_{r(E_r-1)}$, and bits after the code block concatenation are expressed by $g_0, g_1, g_2, g_3, \ldots, g_{G'-1}$. Here, $G' = \lfloor E_{UCI}/C_{UCI} \rfloor \cdot C_{UCI}$, and $G=G'+\mod(E_{UCI}, C_{UCI})$, where G is the total number of coded bits for transmission, and $g_i=0$ for $i=G', G'+1, \ldots, G-1$.

The coded UCI bits generated through the above process are transmitted to a base station via the PUCCH or PUSCH.

Hereinafter, a process of applying the polar code when DCI is transmitted on the PDCCH will be described.

A base station generates a DCI bit sequence, and the DCI transmits downlink control information for one or more cells by using one radio network temporary identifier (RNTI). An encoding operation for the DCI may be performed through information element multiplexing, CRC addition, channel coding, and rate matching.

The DCI format is defined according to usage of each DCI, and is sequentially mapped to information bits $a_0$ to $a_{A-1}$ in fields defined according to the DCI format. If necessary, zero padding bits may be mapped to the information bits or truncation may be applied. If the number of information bits is less than 12 bits, the zero bit is appended until it becomes 12 bits.

Error detection is provided via CRC for DCI transmission. To calculate the CRC parity bit, the entire payload may be used. When payload bits and parity bits are expressed by $a_0, a_1, a_2, a_3, \ldots, a_{A-1}$ and $p_0, p_1, p_2, p_3, \ldots, p_{L-1}$, respectively, "A" denotes the payload size and "L" denotes the number of parity bits. The parity bits are calculated by setting L to 24 and are generated according to the procedure defined by the standard specification. Output bits of the CRC addition process is $b_0, b_1, b_2, b_3, \ldots, b_{K-1}$ where $K=A+L$. When the CRC is added, the CRC parity bits are scrambled with the corresponding RNTI.

After the CRC addition, information bits delivered to the channel coding block is $c_0, c_1, c_2, c_3, \ldots, c_{K-1}$, where K is the number of bits. The information bits are encoded through polar coding, $n_{max}=9$, $I_{IL}=1$, $n_{PC}=0$, and $n_{PC}^{wm}=0$. Coded bits are $d_0, d_1, d_2, d_3, \ldots, d_{N-1}$, where N is the number of coded bits. The above $n_{max}=9$ means that the maximum size of the mother code of the polar code is $2^9=512$, $I_{IL}=1$ means that the information bits are interleaved, and $n_{PC}=0$ means that the number of parity bits is 0 in the polar encoding.

An input bit sequence into the rate matching is $d_0, d_1, d_2, d_3, \ldots, d_{N-1}$, which is set to $I_{BIL}=0$ in the rate matching process and is not bit-interleaved. An output bit sequence after the rate matching is $f_0, f_1, f_2, \ldots, f_{E-1}$.

The coded DCI bits generated through the above process are transmitted to a terminal through the PDCCH.

Methods according to claims or embodiments described in the disclosure may be implemented by hardware or a combination of hardware and software.

When implemented using software, a computer-readable storage medium for storing one or more programs (software modules) may be provided as hardware. One or more programs stored on the computer-readable storage medium are configured for execution by one or more processors in an electronic device. The one or more programs include instructions that cause the electronic device to perform the methods according to claims or embodiments described herein.

Such programs (software module, software) may be stored in a random access memory, a non-volatile memory including a flash memory, a read only memory (ROM), an electrically erasable programmable ROM (EEPROM), a magnetic disc storage device, a compact disc ROM, digital versatile discs (DVDs) or other optical storage devices, and a magnetic cassette. Alternatively, the programs may be stored in a memory combining part or all of those recording media. A plurality of memories may be equipped.

The programs may be stored in an attachable storage device accessible via a communication network formed of Internet, Intranet, local area network (LAN), wide area network (WAN), or storage area network (SAN) alone or in combination. This storage device may access an apparatus performing embodiments of the disclosure through an external port. In addition, a separate storage device in the communication network may access an apparatus performing embodiments of the disclosure.

In the above-described embodiments, components or elements have been expressed as a singular or plural form. It should be understood, however, that such singular or plural representations are selected appropriately according to situations presented for the convenience of description, and the disclosure is not limited to the singular or plural form. Even expressed in a singular form, a component or element may be construed as a plurality of components or elements, and vice versa.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method performed by a terminal in a wireless communication system, the method comprising:
    generating a bit sequence for uplink control information (UCI);
    identifying that a number of bits of the bit sequence is greater than or equal to 360 and a length of rate matching output sequence is greater than or equal to 1088, or identifying that the number of bits of the bit sequence is greater than or equal to 1013;
    performing a code block segmentation for the bit sequence based on the identification;
    generating coded bits by encoding th a plurality of segments based on a polar coding; and
    transmitting, to a base station, the UCI based on the coded bits.

2. The method of claim 1, wherein the bit sequence is segmented into 2 segments.

3. The method of claim 1, wherein the code block segmentation is not performed, in case that the number of bits of the bit sequence is less than 1013 and the length of rate matching output sequence is less than 1088.

4. The method of claim 1,
    wherein each of a cyclic redundancy check (CRC) is attached to the plurality of segments, respectively.

5. A terminal in a wireless communication system, the terminal comprising:
    a transceiver configured to transmit and receive a signal; and
    a controller coupled with the transceiver and configured to:
        generate a bit sequence for uplink control information (UCI),
        identify that a number of bits of the bit sequence is greater than or equal to 360 and a length of rate matching output sequence is greater than or equal to 1088, or identify that the number of bits of the bit sequence is greater than or equal to 1013,
        perform a code block segmentation for the bit sequence based on the identification,
        generate coded bits by encoding a plurality of segments based on a polar coding, and
        transmit, to a base station, the UCI based on the coded bits.

6. The terminal of claim 5, wherein the bit sequence is segmented into 2 segments.

7. The terminal of claim 5, wherein the code block segmentation is not performed in case that the number of bits of the bit sequence is less than 1013 and the length of rate matching output sequence is less than 1088.

8. The terminal of claim 5,
    wherein each of a cyclic redundancy check (CRC) is attached to the plurality of segments, respectively.

9. A non-transitory computer-readable storage medium encoded with instructions which, when executed by a transmitting apparatus comprising a processor, cause the transmitting apparatus to:
    generate a bit sequence for uplink control information (UCI),
    identify that a number of bits of the bit sequence is greater than or equal to 360 and a length of rate matching output sequence is greater than or equal to 1088, or identify that the number of bits of the bit sequence is greater than or equal to 1013,
    perform a code block segmentation for the bit sequence based on the identification,
    generate coded bits by encoding a plurality of segments based on a polar coding, and
    transmit, to a receiving apparatus, the UCI based on the coded bits.

10. The storage medium of claim 9, wherein the bit sequence is segmented into 2 segments.

11. The storage medium of claim 9, wherein the code block segmentation is not performed in case that the number of bits of the bit sequence is less than 1013 and the length of rate matching output sequence is less than 1088.

12. The storage medium of claim 9,
    wherein each of a cyclic redundancy check (CRC) is attached to the plurality of segments, respectively.

* * * * *

UNITED STATES PATENT AND TRADEMARK OFFICE
CERTIFICATE OF CORRECTION

PATENT NO. : 11,012,185 B2  
APPLICATION NO. : 16/376485  
DATED : May 18, 2021  
INVENTOR(S) : Hongsil Jeong et al.

Page 1 of 1

It is certified that error appears in the above-identified patent and that said Letters Patent is hereby corrected as shown below:

In the Claims

Claim 1, at Column 29, Line 37, please replace "generating coded bits by encoding th a plurality of" with --generating coded bits by encoding a plurality of--

Signed and Sealed this  
Twenty-eighth Day of January, 2025

Coke Morgan Stewart  
*Acting Director of the United States Patent and Trademark Office*